(12) United States Patent
Liu et al.

(10) Patent No.: US 9,229,070 B2
(45) Date of Patent: Jan. 5, 2016

(54) APPARATUS AND METHOD FOR RESET AND STABILIZATION CONTROL OF A MAGNETIC SENSOR

(71) Applicant: EVERSPIN TECHNOLOGIES, INC., Chandler, AZ (US)

(72) Inventors: Lianjun Liu, Chandler, AZ (US); Philip Mather, Phoenix, AZ (US); Jon Slaughter, Tempe, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 14/533,842

(22) Filed: Nov. 5, 2014

(65) Prior Publication Data

US 2015/0054502 A1 Feb. 26, 2015

Related U.S. Application Data

(62) Division of application No. 13/286,026, filed on Oct. 31, 2011, now Pat. No. 8,922,205.

(51) Int. Cl.
| | |
|---|---|
| G01R 33/02 | (2006.01) |
| G01R 33/09 | (2006.01) |
| G01R 15/20 | (2006.01) |
| G01R 33/04 | (2006.01) |
| G01R 33/00 | (2006.01) |

(52) U.S. Cl.
CPC ............ *G01R 33/04* (2013.01); *G01R 33/0029* (2013.01); *G01R 33/0041* (2013.01)

(58) Field of Classification Search
CPC ...... G01R 33/093; G01R 33/09; G01R 33/06; G01R 33/098; G01R 33/096; G01R 15/205; G01R 33/0005; G01R 33/0011; G01R 33/28

USPC ........... 324/117 R, 207.21, 207.25, 244, 252, 324/247, 249; 360/324.2, 314, 324, 324.1

See application file for complete search history.

(56) References Cited

U.S. PATENT DOCUMENTS

| | | |
|---|---|---|
| 6,501,678 B1 | 12/2002 | Lenssen et al. |
| 7,054,114 B2 | 5/2006 | Jander et al. |
| 7,057,862 B2 | 6/2006 | Kasiraj et al. |

(Continued)

OTHER PUBLICATIONS

PCT International Search Report and Written Opinion, mailed Feb. 7, 2013, in corresponding PCT application No. PCT/US2012/058294, filed Oct. 1, 2012, 10 pages.

(Continued)

*Primary Examiner* — Tung X Nguyen
*Assistant Examiner* — Neel Shah
(74) *Attorney, Agent, or Firm* — Bookoff McAndrews, PLLC

(57) ABSTRACT

A magnitude and direction of at least one of a reset current and a second stabilization current (that produces a reset field and a second stabilization field, respectively) is determined that, when applied to an array of magnetic sense elements, minimizes the total required stabilization field and reset field during the operation of the magnetic sensor and the measurement of the external field. Therefore, the low field sensor operates optimally (with the highest sensitivity and the lowest power consumption) around the fixed external field operating point. The fixed external field is created by other components in the sensor device housing (such as speaker magnets) which have a high but static field with respect to the low (earth's) magnetic field that describes orientation information.

16 Claims, 11 Drawing Sheets

(56) References Cited

U.S. PATENT DOCUMENTS

| | | |
|---|---|---|
| 7,710,113 B2 | 5/2010 | Crolly et al. |
| 7,772,758 B2 | 8/2010 | Jeong |
| 8,129,998 B2 | 3/2012 | Watanabe et al. |
| 8,283,184 B2 | 10/2012 | Ruehrig |
| 8,922,205 B2 * | 12/2014 | Liu .................... G01R 33/0029 324/246 |
| 2003/0222851 A1 * | 12/2003 | Lai et al. ........................ 345/163 |
| 2004/0137275 A1 | 7/2004 | Jander et al. |
| 2004/0257716 A1 * | 12/2004 | Heim et al. ................ 360/324.1 |
| 2005/0140363 A1 | 6/2005 | Grimm et al. |
| 2005/0174701 A1 * | 8/2005 | Kasiraj et al. .............. 360/324.2 |
| 2006/0009923 A1 | 1/2006 | Shay et al. |
| 2006/0232507 A1 | 10/2006 | Myoung et al. |
| 2008/0106184 A1 | 5/2008 | Jeong |
| 2008/0265347 A1 | 10/2008 | Iwayama et al. |
| 2009/0243607 A1 * | 10/2009 | Mather et al. ................. 324/249 |
| 2010/0053823 A1 | 3/2010 | Iwayama et al. |
| 2011/0074406 A1 | 3/2011 | Mather et al. |

OTHER PUBLICATIONS

International Search Report/Written Opinion mailed Feb. 15, 2013 in PCT/US12/62638.

U.S. Office Action dated Nov. 22, 2011 in U.S. Appl. No. 13/286,026.

U.S. Office Action dated Jan. 6, 2014 in U.S. Appl. No. 13/286,026.

\* cited by examiner

APPARATUS AND METHOD FOR RESET AND STABILIZATION CONTROL OF A MAGNETIC SENSOR

CROSS REFERENCE TO RELATED APPLICATION

This application claims priority to U.S. patent application Ser. No. 13/286,026 filed Oct. 31, 2011, which is incorporated herein by reference.

TECHNICAL FIELD

The exemplary embodiments described herein generally relate to the field of magnetoelectronic devices and more particularly to CMOS compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally are Hall effect devices with flux concentrators or anisotropic magnetoresistance (AMR) based devices. In order to arrive at the required sensitivity and reasonable resistances that mesh well with CMOS, the sensing units of AMR sensors are generally on the order of square millimeters in size, while the auxiliary CMOS associated with hall effect sensors can similarly become large and expensive. For mobile applications, such AMR sensor configurations are too costly in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred. Typically, a Wheatstone bridge structure uses magnetic shields to suppress the response of reference elements within the bridge so that only the sense elements (and hence the bridge) respond in a predetermined manner. However, the magnetic shields are thick and their fabrication requires carefully tuned NiFe seed and plating steps. Another drawback associated with magnetic shields arises when the shield retains a remnant field when exposed to a strong (~5 kOe) magnetic field, since this remnant field can impair the low field measuring capabilities of the bridge structure. To prevent the use of magnetic shields, a Wheatstone bridge structure may include two opposite anti-ferromagnetic pinning directions for each sense axis, resulting in four different pinning directions which must be individually set for each wafer, very often requiring complex and unwieldy magnetization techniques.

A large external field, for example, the field to be measured, that is similar or greater in magnitude and opposite to the applied stabilization field can reduce, cancel, or reverse the stabilization field, resulting in increase in sensor noise and reset reliability problems, preventing an accurate measurement. Furthermore, a large external field opposite to the magnetic device reset direction effectively reverses the reset field and therefore the effectiveness of the reset operation.

Accordingly, it is desirable to provide a magnetoelectronic sensor fabrication method and layout having a high signal to noise ratio for measuring various physical parameters. There is also a need for a simple, rugged and reliable sensor that can be efficiently and inexpensively constructed as an integrated circuit structure for use in mobile applications. There is also a need for an improved magnetic field sensor and method to overcome the problems in the art, such as outlined above. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A field sensor is configured for resetting sense elements prior to measurement of a field.

A first exemplary method for measuring an external field by a plurality of magnetic sense elements comprises providing a first reset field pulse to orient the magnetic sense elements; providing a first stabilization field to the plurality of magnetic sense elements; detecting an external field component in the direction of the first stabilization field as sensed by the magnetic sense elements; determining a magnitude of at least one of a second reset field pulse and of a second stabilization field; applying at least one of the second reset field pulse prior to measuring an external field direction and magnitude, and the second stabilization field while measuring the external field direction and magnitude; and measuring the external field direction and magnitude.

A second exemplary method for measuring an external field by a plurality of magnetic sense elements comprises providing a first reset current pulse to a first current line adjacent to each of the magnetic sense elements for creating a first reset field pulse; providing a first stabilization current to a first current line adjacent each of the magnetic sense elements for creating a first stabilization field; determining an external field component in the direction of the first stabilization field as sensed by circuitry coupled to the magnetic sense elements; determining at least one of a second reset current pulse and a second stabilization current for creating a reset field pulse and a second stabilization field, respectively; applying at least one of the second reset current pulse prior to measuring external field direction and magnitude and the second stabilization current while measuring an external field direction and magnitude; and measuring the external field direction and magnitude.

An exemplary magnetic field sensor includes a bridge circuit including a plurality of magnetic sense elements configured to sense an external field, the plurality of magnetic sense elements each having an axis; a current line adjacent to each of the plurality of magnetic sense elements; first circuitry configured to apply a first reset current pulse and subsequently apply a first stabilization current on the current line; and measure the magnitude and direction of the external field as sensed by the plurality of magnetic sense elements and determine a component of the external field in the direction of the axis; second circuitry configured to determine a magnitude and direction of at least one of a second reset current pulse and a second stabilization current for creating a second reset field pulse and a second stabilization field, respectively, apply at least one of the reset field prior to measuring external field direction and magnitude or the second stabilization field while measuring external field direction and magnitude; and measure the external field direction and magnitude

BRIEF DESCRIPTION OF THE DRAWINGS

The present invention will hereinafter be described in conjunction with the following drawing figures, wherein like numerals denote like elements.

DETAILED DESCRIPTION

Figure 1:
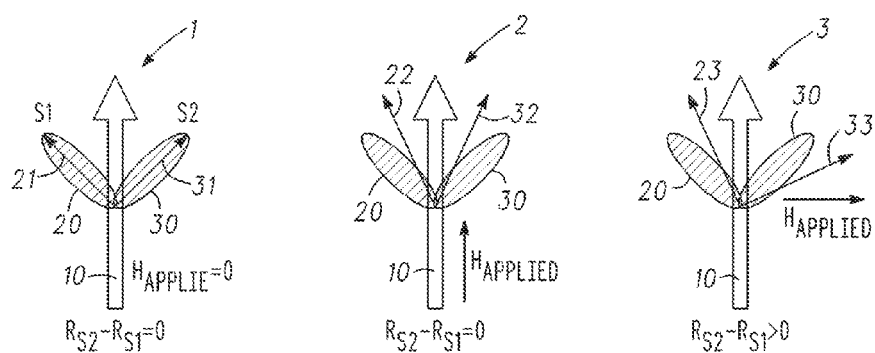
FIG. 1 illustrates two active sense elements having magnetizations that are angled equally in different directions from a pinned layer that will deflect in response to an externally applied magnetic field and provide an output signal related to the component of the magnetic field that is not aligned with the pinning direction of the pinned layer.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A method and apparatus are described for a differential sensor array in which sense elements formed over pinned layers are dynamically reset and stabilized with reset and stabilization field pulses, whose current magnitude and direction are determined from a sensed external field component, and are applied (e.g., during each measurement cycle) to the differential sensor array. Using shape anisotropy, the shapes of two sense element arrays may be formed to have magnetizations that are angled equally in different directions from a single magnetization direction of the pinned layer so that the sense layers will deflect in response to an externally applied magnetic field. With this configuration, a single axis magnetic sensor may be formed from a single pinning direction, or a compass circuit may be formed from three such differential sensors circuits so that only two pinning directions are required for the entire three axis compass, thereby simplifying and reducing the manufacturing cost and complexity. In an example implementation, each differential sensor circuit is constructed as a Wheatstone bridge structure in which four arrays of unshielded active sense elements are used to detect and measure an externally applied magnetic field.

To address field fluctuations that can impair the field response of a sense element, the sensor layers may be dynamically stabilized by applying a reset field pulse either before each field measurement or at a predetermined interval to prepare the magnetic sensor, thereby eliminating the need for any hard bias layer(s) to stabilize the sense elements. Without such hard bias stabilization or a measurement preparation capability (reset field), a momentary exposure to a large field may reorient the magnetization of the sense elements in a poorly determined state. The sense array is optimally sized for highest possible signal-to-noise (SNR) while allowing the available voltage supply to stabilize the sensors with the required current and the resulting stabilization field during the measurement phase. For the smallest possible physical array size, and hence the lowest cost, a copper line (or parallel connected series of line segments) is preferably routed underneath and above each sense element. In the stabilization (or measurement) phase, each of these line segments is connected in series so that each sense element has the identical stabilization field and hence identical sensor response. Therefore, the array averaging is precise and SNR is increased the maximal amount for a given array size. To prepare the sense elements for field measurement, an orienting reset field pulse is applied along the stabilization path prior to applying the stabilization field.

This reset may be periodic, precede each measurement, or only occur when an error condition (very high bridge offset indicating misorientation, linearity errors, or high noise condition) is encountered. As the individual sense element anisotropy is large compared with the stabilization field that must be applied for noise optimization but on the same order as the field required to reorient the sense element, the magnitude of the orientation field pulse is much larger than that applied during the measurement phase for sensor stabilization. Therefore, the available voltage is insufficient to reset an array that is sized for maximal SNR. Subsequent to the preparation phase, all line segments within a bridge or sense axis are connected in series, and stabilization current is applied to these segments and a measurement may proceed.

In many compass applications, the magnetometer most operate in the presence of a static, but large (on the scale of the 0.5 Gauss Earth's magnetic field) interfering field that indicates sensor orientation. As the magnitude and direction of this interfering field are determined by mounting geometry in the final device (i.e. distance from the speaker magnet in a particular cell phone model), and vary from device to device, it is desirable to utilize an adaptive method stabilization and sensor resetting method. Such a method may change the amplitude and polarity of the reset pulse and stabilization fields differently for each sensor axis, to overcome the static field projects, work in tandem with it to optimize device signal, power and reset reliability for each particular device and field profile, depending upon the projection of the interfering field on each sense axis. In order to mitigate the impact of the external field conflicting with the stabilization field, a first stabilization current is applied to a current line adjacent the magnetic sense elements and an external field component aligned with a stabilization field and created by the first stabilization current is determined. In a first exemplary embodiment, a magnitude and direction of a second stabilization current (that produces a second stabilization field) is determined that, when applied to the magnetic sense elements, nullify this conflict during measure of the external field. In another exemplary embodiment, a magnitude and direction of a reset current (that produces a reset field) is determined that, when applied to the magnetic sense elements, nullify this conflict during measure of the external field. In yet another exemplary embodiment, a hard axis field is applied by applying a current through a self test line during reset. In still another exemplary embodiment, the direction of the second stabilization field and the reset field is reversed from the first stabilization field if the external field is opposite to the internal stabilization field. If the absolute value of the second stabilization field is greater than a threshold, the second stabilization field is not applied as the external field direction is coincident with the desired stabilization field and can be utilized in lieu of the internal stabilization field. If the absolute value of the second stabilization field is not greater than a threshold, the second stabilization field is applied, and the external field direction and strength is measured by the magnetic sensor.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

It will be appreciated that additional processing steps will be used to fabricate of MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

A method for measuring an external field by a plurality of magnetic sense elements comprises providing a a first reset field pulse followed by a first stabilization field to the plurality of magnetic sense elements; detecting an external field component in the direction of the first stabilization field as sensed by the magnetic sense elements; determining a magnitude of at least one of a second reset field pulse and of a second stabilization field needed to optimize the performance of the magnetic sensor given the strength and orientation of the external field; applying at least one of: the second reset field prior to measuring external field direction and magnitude, and the second stabilization field while measuring the external field direction and magnitude; and measuring the external field direction and magnitude.

Turning now to FIG. 1, a sensor structure 1 is shown in simplified schematic form which uses two active sense element types 20, 30 and a pinned layer 10 to measure an external magnetic field. As depicted, the magnetization directions 21, 31 of the active sense elements 20, 30 are angled equally and in different directions from the magnetization direction of a pinned layer 10. To this end, the sense elements 20, 30 may be formed so that the shape of each sense element is elongated in the direction of the desired magnetization for that sense element. Thus, sense elements 20, 30 use their shape anisotropy to create magnetization directions that are offset from the pinned layer 10. For example, the first sense element 20 may be formed so that its preferred magnetization direction is angled at −135 degrees from the magnetization direction of the pinned layer 10, and with the second sense element 30 so that its preferred magnetization direction is angled at 135 degrees from the magnetization direction of the pinned layer 10, although other offset angles may be used.

Because the conductance across a sense element and pinned layer depends on the cosine of the angle between the sense element and the pinned layer, the conductance of the sensor structure can be changed by applying an external magnetic field (H) which deflects the magnetization of the sensor elements 20, 30. For example, if there is no applied field (H=0) to a sensor structure 1, then the magnetization directions 21, 31 of the sense elements 20, 30 are unchanged, and there is no difference between the conductance of the first and second sensor elements 20, 30. And if an external field H is applied to a sensor structure 2 that is directed along or anti-parallel to the pinned layer 10, the applied field will deflect or rotate the magnetic moments 22, 32 of the sensor elements 20, 30 equally, resulting in equal conductance changes for each sense element, and hence no change in their difference. However, when an external field H is applied to a sensor structure 3 that is orthogonal to the pinned layer 10, the magnetic moments 23, 33 for each sense element 20, 30 are changed differently in response to the applied field. For example, when the external field H shown in FIG. 1 is directed to the right, the conductance of the first sense element 20 is increased, while the conductance of the second sense element 30 is reduced, resulting in a difference signal that is related to the field strength. In this way, the depicted sensor structure measures the projection of the applied field perpendicular to the pinned axis, but not parallel to it.

Figure 2:
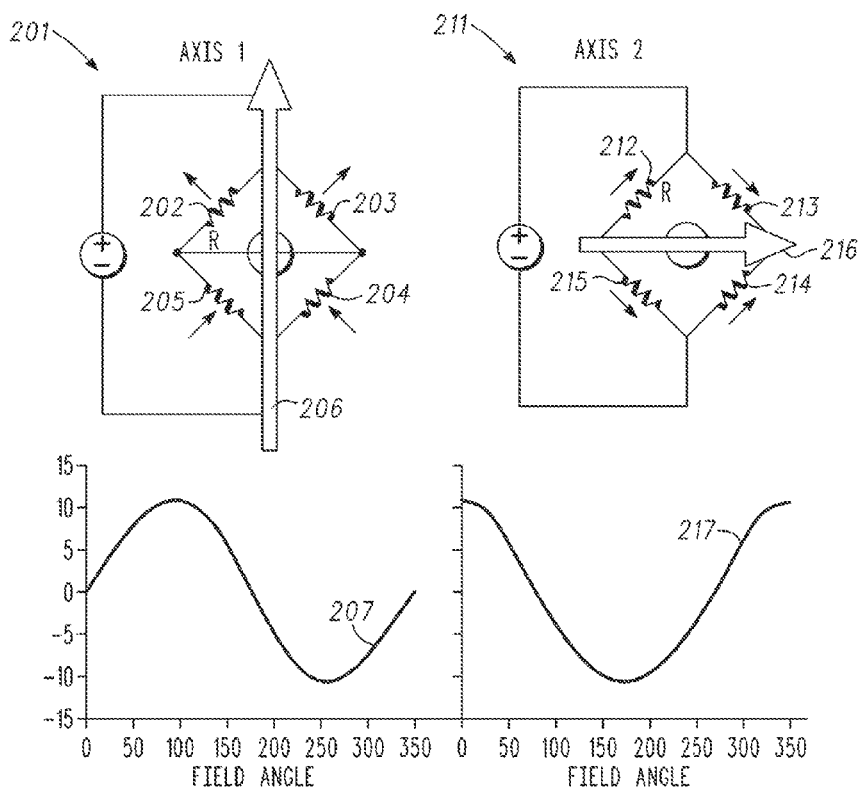
FIG. 2 illustrates an electronic compass structure which uses differential sensors formed from two bridge structures with unshielded MTJ sensors, along with the circuit output for each bridge structure.

FIG. 2 shows first and second sensors 201, 211 for detecting the component directions of an applied field along a first y-axis (Axis 1) and a second x-axis (Axis 2), respectively. As depicted, each sensor is formed with unshielded sense elements that are connected in a bridge configuration. Thus, the first sensor 201 is formed from the connection of sense elements 202-205 in a bridge configuration over a pinned layer 206 that is magnetized in a first direction. In similar fashion, the second sensor 211 is formed from the connection of sense elements 212-215 in a bridge configuration over a pinned layer 216 that is magnetized in a second direction that is perpendicular to the magnetization direction of the pinned layer 206. In the depicted bridge configuration 201, the sense elements 202, 204 are formed to have a first magnetization direction and the sense elements 203, 205 are formed to have a second magnetization direction, where the first and second magnetization directions are orthogonal with respect to one another and are oriented to differ equally from the magnetization direction of the pinned layer 206. As for the second bridge configuration 211, the sense elements 212, 214 have a first magnetization direction that is orthogonal to the second magnetization direction for the sense elements 213, 215 so that the first and second magnetization directions are oriented to differ equally from the magnetization direction of the pinned layer 216. In the depicted sensors 201, 211, there is no shielding required for the sense elements, nor are any special reference elements required. In an example embodiment, this is achieved by referencing each active sense element (e.g., 202, 204) with another active sense element (e.g., 203, 205) using shape anisotropy techniques to establish the easy magnetic axes of the referenced sense elements to be deflected from each other by 90 degrees.

By positioning the first and second sensors 201, 211 to be orthogonally aligned with the orthogonal sense element orientations in each sensor being deflected equally from the sensor's pinning direction, the sensors can detect the component directions of an applied field along the first and second axes. This is illustrated in FIG. 2 with the depicted circuit simulation shown below each sensor. In each simulation, the simulated bridge output 207, 217 is a function of an applied field angle for sense elements with an anisotropy field of 10 Oe, applied field of 0.5 Oe, and a magnetoresistance of 100% when the sense element switches from an anti-parallel state to a parallel state. The simulated bridge outputs can be used to uniquely identify any orientation of the applied external field. For example, a field that is applied with a 0 degree field angle (e.g., pointing "up" so that it is aligned with the y-axis or Axis 1) will generate a bridge output of 0 mV/V from the first sensor 201, and will generate a bridge output of 10 mV/V from the second sensor 201. Conversely, a field that is applied in the opposite direction (e.g., pointing "down" so that it is aligned with a 180 degree field angle) will generate a bridge output of 0 mV/V from the first sensor 201, and will generate a bridge output of −10 mV/V from the second sensor 201.

As seen from the foregoing, a magnetic field sensor may be formed from differential sensors 201, 211 which use unshielded sense elements 202-205, 212-215 connected in a bridge configuration over respective pinned layers 206, 216 to detect the presence and direction of an applied magnetic field. With this configuration, the possibility of residual magnetic moment present in magnetic shielding, or NiFe flux concentrators and flux guides; such as may be present for hall devices with triaxial response, is eliminated is eliminated. In addition, the magnetic field sensor provides good sensitivity, and also provides the temperature compensating properties of a bridge configuration. By eliminating the need to form magnetic shielding layers, the manufacturing complexity and cost is reduced and the size of the sensor structure is decreased (in terms of eliminating the silicon real estate required to form any shielding layers). There are also performance benefits to using unshielded sense elements since the magnetic remnance problem is eliminated by removing the magnetic shielding layers.

Figure 3:
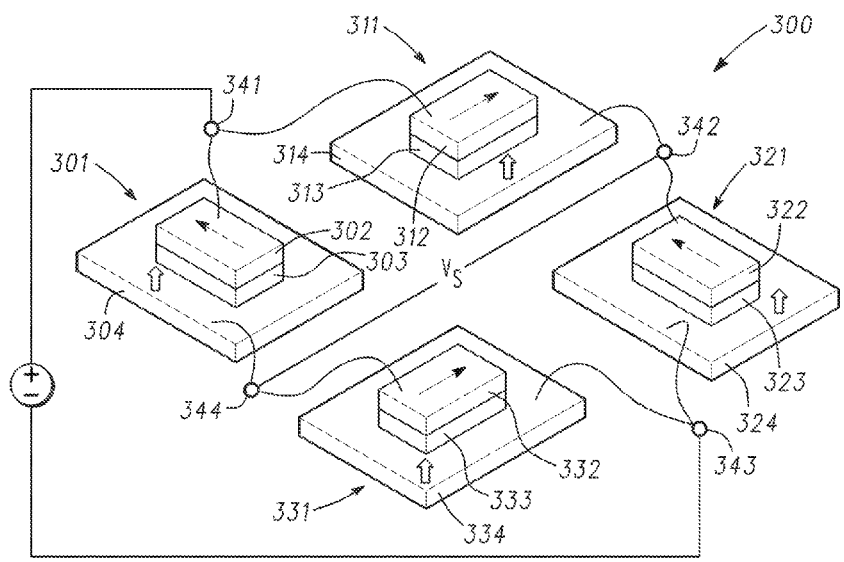
FIG. 3 is a simplified schematic perspective view of a Wheatstone bridge circuit in which series-connected MTJ sensors are aligned to have different magnetization directions from the magnetization direction of the pinned layer.

FIG. 3 provides a simplified schematic perspective view of an example field sensor 300 formed by connecting four MTJ sensors 301, 311, 321, 331 in a Wheatstone bridge circuit, where the series-connected MTJ sensors 301, 311, 321, 331 are formed with sense layers 302, 312, 322, 332 that are aligned to have different magnetization directions from the magnetization direction of the pinned layers 304, 314, 324, 334. The depicted sensor 300 is formed with MTJ sensors 301, 311, 321, 331 that may be manufactured as part of an existing MRAM manufacturing process with only minor adjustments to control the orientation of the magnetic field directions for different layers. In particular, each MTJ sensor 301, 311, 321, 331 includes a first pinned electrode 304, 314, 324, 334, an insulating tunneling dielectric layer 303, 313, 323, 333, and a second sense electrode 302, 312, 322, 332. The pinned and sense electrodes are desirably magnetic materials, for example, and not intended to be limiting, NiFe, CoFe, Fe, CoFeB and the like, or more generally, materials whose magnetization can be collectively aligned. Examples of suitable electrode materials and arrangements are the materials and structures commonly used for electrodes of magnetoresistive random access memory (MRAM) devices, which are well known in the art and contain, among other things, ferromagnetic materials. The pinned and sense electrodes may be formed to have different coercive force or field requirements. The coercive field is basically the amount of field that is required to reverse the magnet from one direction to another after saturation. Technically, it is the magnetic field required to return the magnetization of the ferromagnet to zero after it has been saturated. For example, the pinned electrodes 304, 314, 324, 334 may be formed with an anti-ferromagnetic film exchange coupled to a ferromagnetic film to with a high coercive field so that their magnetization orientation can be pinned so as to be substantially unaffected by movement of an externally applied magnetic field. In contrast, the sense electrodes 302, 312, 322, 332 may be formed with a magnetically soft material to provide different anisotropy axes having a comparatively low coercive force so that the magnetization orientation of the sense electrode (in whatever direction it is aligned) may be altered by movement of an externally applied magnetic field. In selected embodiments, the coercive field for the pinned electrodes is about two orders of magnitude larger than that of sense electrodes, although different ratios may be used by adjusting the respective coercive fields of the electrodes using well known techniques to vary their composition and/or pinning strength.

As shown in FIG. 3, the pinned electrodes 304, 314, 324, 334 in the MTJ sensors are formed to have a first exemplary anisotropy axis alignment in the plane of the pinned electrode layers 304, 314, 324, 334 (identified by the vector arrows pointing toward the top of the drawing of FIG. 3). As described herein, the anisotropy axis alignment for the pinned electrodes 304, 314, 324, 334 may be obtained using shape anisotropy of the pinned electrodes, in which case the shapes of the pinned electrodes 304, 314, 324, 334 would each be longer in the direction of the "up" vector arrow for a single layer pinned magnetic stack. In addition or in the alternative, the anisotropy axis alignment for the pinned electrodes 304, 314, 324, 334 may be obtained by forming one or more magnetic layers in the presence of a saturating magnetic field that is subsequently or concurrently annealed and then cooled so that the magnetic field direction of the pinned electrode layers is set in the direction of the saturating magnetic field. As will be appreciated, the formation of the anisotropy axis alignment for the pinned electrodes 304, 314, 324, 334 must be reconciled with the fabrication steps used to form any other field sensors which include pinned electrodes having a distinct anisotropy axis alignment, as well as any fabrication steps used to form any sense electrodes having a distinct anisotropy axis alignment.

The depicted field sensor 300 also includes MTJ sensors 301, 321 in which sense electrodes 302, 322 are formed to have an exemplary anisotropy axis (identified by the left-pointing vector arrows) that is offset from the anisotropy axis of the pinned electrodes by a first deflection angle. In addition, the depicted field sensor 300 includes MTJ sensors 311, 331 in which sense electrodes 312, 332 are formed to have an exemplary anisotropy axis (identified by the right-pointing vector arrows) that is offset from the anisotropy axis of the pinned electrodes by a second deflection angle which is equal but opposite to the first deflection angle. In a particular embodiment, the first deflection angle is perpendicular to the second deflection angle so that anisotropy axis of the sense electrodes 302, 322 is rotated negative 45 degrees with respect to the anisotropy axis of the pinned electrodes, and so that anisotropy axis of the sense electrodes 312, 332 is rotated positive 45 degrees with respect to the anisotropy axis of the pinned electrodes.

As will be appreciated, the MTJ sensors 301, 311, 321, 331 may be formed to have identical structures that are connected as shown in series by metal interconnections in a standard Wheatstone bridge circuit configuration with both power supply terminals 341, 343 and output signal terminals 342, 344 for the bridge circuit being shown. By connecting in series the unshielded MTJ sensors 301, 311, 321, 331 in a Wheatstone bridge circuit, the field sensor 300 detects the horizontal direction (left to right in FIG. 3) component of an externally applied magnetic field, thereby forming an X-axis sensor bridge. In particular, a horizontal field component would deflect the magnetization of the sense electrodes 302, 322 differently from the deflection of the magnetization of the sense electrodes 312, 332, and the resulting difference in sensor conductance/resistance would quantify the strength of the horizontal field component. Though not shown, a Y-axis sensor bridge circuit may also be formed with unshielded MTJ sensors connected in a Wheatstone bridge circuit configuration, though the anisotropy axis of the pinned electrodes in the Y-axis sensor bridge circuit would be perpendicular to the anisotropy axis of the pinned electrodes 304, 314, 324, 334 in the X-axis sensor bridge. Each of these sensors (or bridge legs) 301, 311, 321, 331 may represent an array of sense elements working in concert to increase the overall SNR of the system.

Low field magnetic sensors are susceptible to Barkhausen noise, sporadic de-pinning, jumps of micro-magnetic domains resulting from different regions in the magnetic sense element that may have slightly different orientations of their local magnetic moment from weak localized magnetization pinning caused by edge roughness, or small local inhomogeneities in the sense layer, or a myriad of other sources. Such noise can introduce errors in accurately measuring the angular resolution of the Earth's magnetic field. When a field is applied, these micro-magnetic domains may reverse in a sequential fashion in lieu of the desired coherent rotation of the sense element. Prior attempts to address such noise have used a hard magnetic bias layer in the sense layers to pin the ends of the device. However, hard bias layers can reduce the sensitivity of the sensor, and have the additional disadvantages of requiring an additional processing layer, etch step and anneal step.

To address the Barkhausen noise problem, a magnetic field may be selectively applied along the easy axis of the sense element prior to performing a measurement. In selected embodiments, the magnetic field is applied as a brief field pulse that is sufficient to restore the magnetic state of the sense element and remove micro-magnetic domains that may have appeared as the result of exposure to a strong field. In an example implementation, a field pulse is applied to a sensor to remove metastable pinned regions in the sense element, where the field pulse has a threshold field strength (e.g., above approximately 40 Oe) and a minimum pulse duration (e.g., of approximately 2-100 nanoseconds). By applying such a field pulse with a predetermined measurement period (e.g., 10 Hz) as required for a compass application, the resulting field pulse has an extremely low duty cycle and minimal power consumption. In addition, by terminating the field pulse prior to measurement, there is no additional field applied to the sense element during measurement, resulting in maximal sensitivity. Alternatively, a much lower stabilizing field may be applied through the same reset line during sensor measurement, minimally impacting the sensitivity, but encouraging clean coherent rotation of the sense element magnetization. Additionally, the field imposed by magnetic sense elements within the device housing the sensor may be taken into account to calculate the optimal direction and magnitude of the stabilization and reset field.

Figure 4:
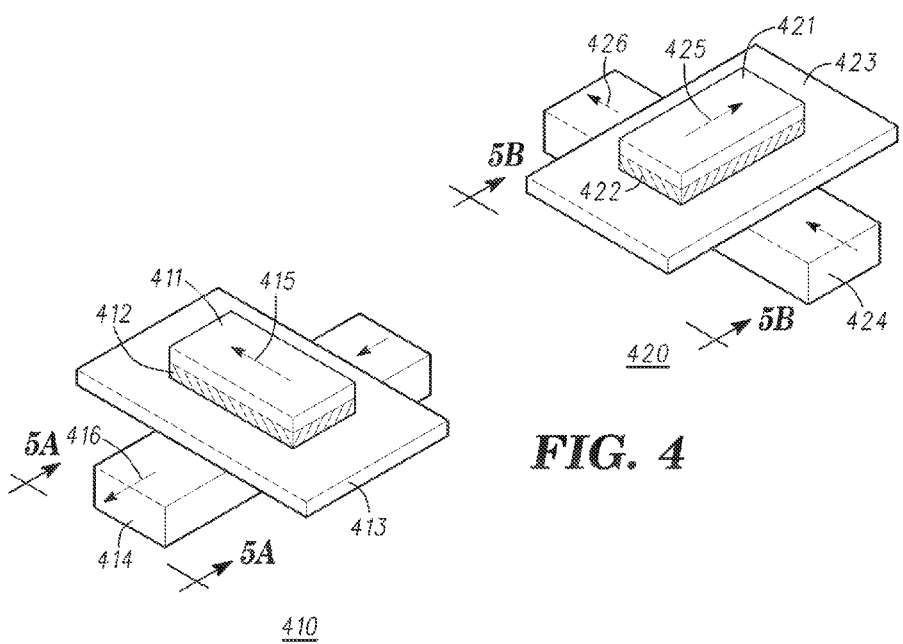
FIG. 4 is a partial schematic perspective view of first and second MTJ sensors which include a magnetic field generator structure for clearing or stabilizing the sense layer prior to or during sense operations.

To illustrate an example of how a field pulse may be applied to a sense element, reference is now made to FIG. 4, which shows a partial schematic perspective view of first and second MTJ sensors 410, 420 which each include a magnetic field generator structure 414, 424 for resetting or stabilizing the sense layer 411, 421 prior to or during sense operations. Each MTJ sensor may be constructed as shown in FIG. 4 where the magnetic direction of the sense layer determines the orientation of the magnetic field generator structure. In particular, each MTJ sensor generally includes an upper ferromagnetic layer 411, 421, a lower ferromagnetic layer 413, 423, and a tunnel barrier layer 412, 422 between the two ferromagnetic layers. In this example, the upper ferromagnetic layer 411, 421 may be formed to a thickness in the range 10 to 10000 Angstroms, and in selected embodiments in the range 10 to 100 Angstroms, and functions as a sense layer or free magnetic layer because the direction of its magnetization can be deflected by the presence of an external applied field, such as the Earth's magnetic field. As for the lower ferromagnetic layer 413, 423, it may be formed to a thickness in the range 10 to 2000 Angstroms, and in selected embodiments in the range 10 to 100 Angstroms, and functions as a fixed or pinned magnetic layer when the direction of its magnetization is pinned in one direction that does not change magnetic orientation direction during normal operating conditions. As described above, the first and second MTJ sensors 410, 420 may be used to construct a differential sensor by forming the lower pinned layers 413, 423 to have the same magnetization direction (not shown), and by forming the magnetization direction 415 in upper sense layer 411 to be orthogonal to the magnetization direction 425 in upper sense layer 421 so that the magnetization directions 415, 425 are oriented in equal and opposite directions from the magnetization direction of the lower pinned layers 413, 423.

To restore the original magnetization of the upper sense layers 411, 421 that can be distorted by magnetic domain structure, FIG. 4 depicts a magnetic field generator structure 414, 424 formed below each sensor. In selected embodiments, the magnetic field generator structure 414, 424 is formed as a conducting current line which is oriented to create a magnetic field pulse which aligns with the magnetization direction 415, 425 in the upper sense layer 411, 421. For example, when a current pulse flows through the magnetic field generator structure 414 below the first MTJ sensor 410 in the direction indicated by the arrow 416, a field pulse is created that is aligned with the easy axis 415 of the sense element 411 in the first MTJ sensor 410. However, since the second MTJ sensor 420 has a sense layer 421 with a different magnetization direction 425, the magnetic field generator structure 424 is oriented so that a field pulse is created that is aligned with the easy axis 425 of the sense element 421 in the second MTJ sensor 420 when a current pulse flows through the magnetic field generator structure 424 in the direction indicated by the arrow 426.

Various illustrative embodiments of the process integration will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

Figure 5:
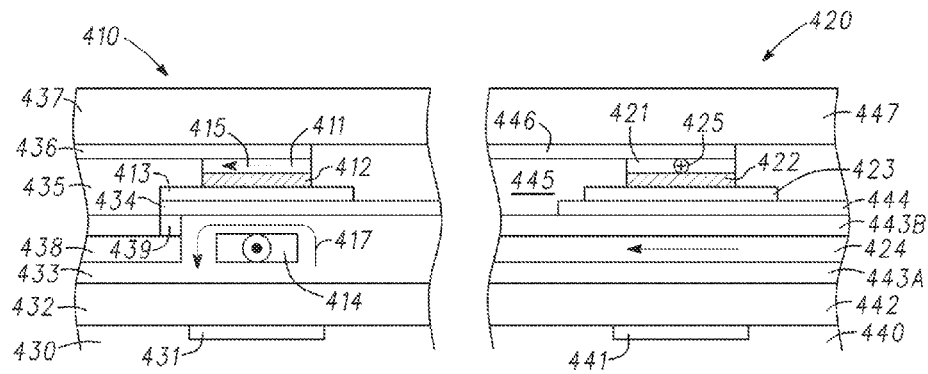
FIG. 5 is a partial cross-sectional view of an integrated circuit in which the first and second MTJ sensors shown in FIG. 4 are formed to have sense layers with different magnetization directions.

The relative alignment of the field pulse and easy axis directions may also be seen in FIG. 5, which depicts a partial cross-sectional view of an integrated circuit device in which the first and second MTJ sensors shown in FIG. 4 are formed to have sense layers 411, 421 with different magnetization directions. In particular, the cross-sectional view on the left shows the first MTJ sensor 410 as seen from the perspective view 5A in FIG. 4, while the cross-sectional view on the right shows the second MTJ sensor 420 as seen from the perspective view 5B in FIG. 4. The first and second MTJ sensors 410, 420 are each formed over a substrate 430, 440 which may have an active circuit 431, 441 embedded therein. On the substrate, one or more circuit layers 432, 442 may be formed before forming an insulating layer 433, 443 in which a conductive line 414, 424 is embedded to form a magnetic field generator structure. As shown in FIG. 5, the conductive line 414 in the first MTJ sensor 410 is formed to carry current in the direction coming out of plane of the drawing of FIG. 5, while the conductive line 424 in the second MTJ sensor 420 is formed to carry current moving right-to-left on the drawing. Over the embedded conductive lines, the first and second MTJ cores are formed in an insulating layer 435, 445. In particular, the first MTJ core in the first MTJ sensor 410 includes a first conductive line 434 at least partially embedded in the insulating layer 435, a lower pinned ferromagnetic layer 413, a tunnel barrier layer 412, an upper sense ferromagnetic layer 411 having a magnetization direction 415 that is oriented right-to-left, and a second conductive line 436 over which is formed an additional dielectric layer 437. The first conductive layer 434 is connected to a bottom contact layer 438 through a via structure 439. In addition, the second MTJ core in the second MTJ sensor 420 includes a first conductive line 444 at least partially embedded in the insulating layer 445, a lower pinned ferromagnetic layer 423, a tunnel barrier layer 422, an upper sense ferromagnetic layer 421 having a magnetization direction 425 that is oriented into the plane of the drawing of FIG. 5, and a second conductive line 446 over which is formed an additional dielectric layer 447. To connect the first and second MTJ sensors 410, 420, the first conductive layer 444 in the second MTJ sensor 420 is connected through a via structure (not shown) to a bottom contact layer (not shown) in the same level as the embedded conductive line 424, which in turn is connected through one or more vias and conductive layers to the second conductive line 436 from the first MTJ sensor 410. With the depicted configuration, current pulses through the embedded conductive line 414 will create a magnetic field pulse 417 which is aligned with the easy axis 415 of the sense element 411, and current pulses through the embedded conductive line 424 will create a magnetic field pulse in the region of the sense element 421 (not shown) which is aligned with the easy axis 425 of the sense element 421.

The lower pinned ferromagnetic and pinning antiferromagnetic layers 413, 423 may be a material, for example, iridium manganese, platinum manganese, cobalt iron, cobalt iron boron, nickel iron, ruthenium, and the like, or any combination thereof. The tunnel barrier layers 412, 422 may be an insulating material, for example, aluminum oxide or magnesium oxide. The upper sense ferromagnetic layers 411, 421 may be a ferromagnetic material, for example, nickel iron, cobalt iron, cobalt iron boron, ruthenium, and/or the like. The magnetic field generator structures 414, 424 may be aluminum, copper, tantalum, tantalum nitride, titanium, titanium nitride or the like, while conductive lines in general may be, for example, aluminum, copper, tantalum, tantalum nitride, titanium, titanium nitride or the like.

The first and second MTJ sensors 410, 420 may be fabricated together on a monolithic integrated circuit as part of a differential sensor by forming sense layers 411, 421 having orthogonal magnetic orientations that each differ equally from the magnetic direction of the pinned layers 413, 423. In an example process flow, the first step in the fabrication process is to provide a monolithic integrated circuit chip substrate which is covered by a dielectric base layer (not shown). Over the dielectric base layer, magnetic field generator structures 414, 424 are formed as embedded lines of conductive material using known deposition, patterning and etching processes so that the magnetic field generator structures 414, 424 are aligned and positioned below the sensors 410, 420 and embedded in an insulating layer (not shown). Upon the insulating layer, a stack of sensor layers is sequentially formed by depositing a first conductive layer (to serve after etching as the conductive line 434), one or more lower ferromagnetic layers (to serve after etching as the lower pinned ferromagnetic layer 413), one or more dielectric layers (to serve after etching as the tunnel barrier layer 412), one or more upper ferromagnetic layers (to serve after etching as the upper sense ferromagnetic layer 411), and a second conductive layer (to serve after etching as the conductive line 436).

While the various ferromagnetic layers may each be deposited and heated in the presence of a magnetic field to induce a desired magnetic orientation, shape anisotropy techniques may also be used to achieve the required magnetic orientations for the different ferromagnetic layers. To this end, the sensor layer stack is selectively etched with a sequence of patterned etch processes to define the pinned and sense layers in the MTJ sensors 410, 420. In a first etch sequence, the shapes of the different pinning layers 413, 423 are defined from the lower ferromagnetic layer(s) by using patterned photoresist to form a first patterned hard mask and then performing a selective etch process (e.g., reactive ion etching) to remove all unmasked layers down to and including the unmasked lower ferromagnetic layer(s). The resulting shapes of the etched lower ferromagnetic layers are oriented so that each pinned layer has shape anisotropy, resulting in a preferred magnetic orientation along one of its axes. In addition to being formed as long and narrow shapes, additional shaping of the ends of pinned layers may be provided so that each of the pinned layers performs more like a single magnetic domain during the magnetic setting procedure. Using shape anisotropy, the shaped pinned layers 413, 423 may be annealed to set their respective pinning directions.

At this point in the fabrication process, the upper ferromagnetic layer(s) will have been selectively etched to leave a remnant portion under the first patterned hard mask so that the upper and lower ferromagnetic layer(s) have the same shape. However, the final shape of the sense layers will be smaller than the underlying pinned layers, and to this end, a second etch sequence is used to define the final shapes of the different sense layers 411, 421 from the remnant portions of the upper ferromagnetic layer(s). In the second etch sequence, another photoresist pattern is used to form a patterned hard mask over the parts of the remnant upper ferromagnetic layer(s) layer that will form the sense layers. The pattern is selected to define high aspect ratio shapes for the sense layers when a selective etch process (e.g., reactive ion etching) is used to remove all unmasked layers down to and including the unmasked upper ferromagnetic layer(s) 411, 421. In selected embodiments, the selective etch process may leave intact the underlying shaped pinned layers 413, 423, though in other embodiments, the selective etch process also etches the unmasked portions of the underlying shaped pinned layers 413, 423. The defined high aspect ratio shapes for the sense layers are oriented so that the sense layers 411 are longer in the dimension of the desired magnetization 415 than they are wide, while the sense layers 421 are longer in the dimension of the desired magnetization 425 than they are wide. In other words, the long axis for each sense layer is drawn along the desired magnetization direction for a single ferromagnetic sense layer. In addition to being formed as long and narrow shapes, additional shaping of the ends of sense layers 411, 421 may be provided so that each of the sense layers performs more like a single magnetic domain. For example, the sense layers may be shaped to have pointed ends that taper in the corresponding directions of desired easy axis for the sense layers. Once the shaped sense layers are formed, the desired easy axis magnetic orientations may be induced from their shape anisotropy by briefly annealing the wafer (e.g., at an anneal temperature of approximately 250 degrees C. in the absence of a magnetic field to remove material dispersions. Upon cooling, the magnetizations of the sense layers 411, 421 align with the individual pattern, providing multiple orientations of sense layers.

Figure 6:
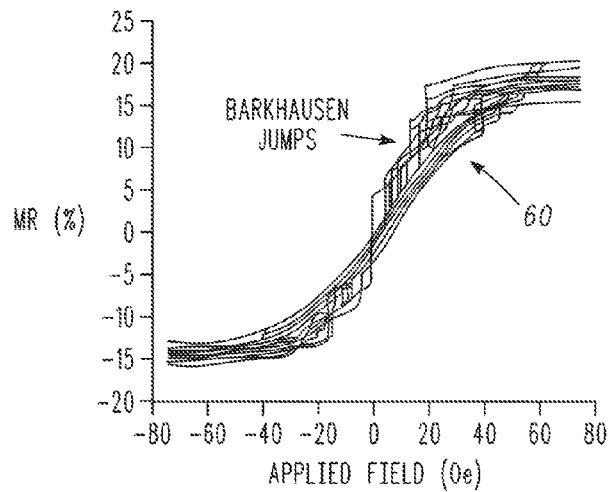
FIG. 6 is an example plot of the magneto-resistance against the applied field when no stabilization field is applied to the sensor.
Figure 7:
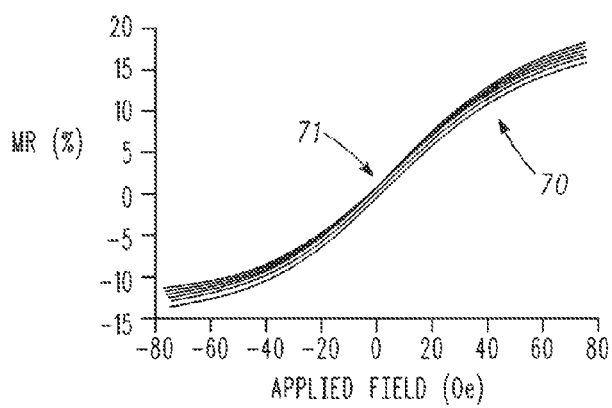
FIG. 7 is an example plot of the magneto-resistance against the applied field when a steady state stabilization field is applied to the sensor.
Figure 8:
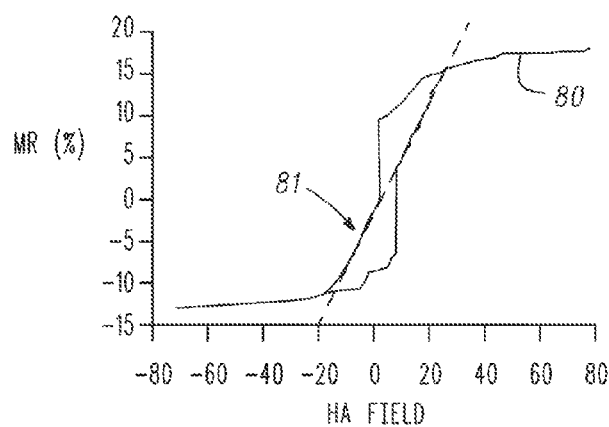
FIG. 8 is an example plot of the magneto-resistance against the applied field when a pre-measurement reset pulse is applied to the sensor.

By controlling the magnitude, direction, and timing of the current flow through the magnetic field generator structures 414, 424 so as to create a field pulse just prior to using the sensors 410, 420 to perform a field measurement, the sense layers 411, 421 are prepared before each measurement in a way that maintains high sensitivity and minimizes power consumption. While an improved method which is adaptively adjusted for the magnitude and direction of the external magnetic field from the device housing the magnetic sensor will be described below, the benefits of selectively applying a magnetic field for low or no external magnetic field to the sense elements are demonstrated in FIGS. 6-8. Starting with FIG. 6, there is provided an example plot of the magnetoresistance against the applied field when no stabilization field is applied to the sensor. Without a stabilization field, the micro-magnetic domain jumps cause the transfer curve 60 to have sporadic, unpredictable jumps in magneto-resistance (a.k.a., Barkhausen noise) as an applied field is swept. This noise may be prevented by applying a weak stabilization field in alignment with the easy axis of the sense element. For example, FIG. 7 provides an example plot of the magneto-resistance against the applied field when a 15 Oe easy axis stabilization field is applied as a steady state field to the sensor. As shown in the plot of FIG. 7, the micro-magnetic domain jumps have been eliminated. As a consequence, the transfer curve 70 in this example includes a region of linear characteristics 71 up to an applied field of approximately 20 Oe. In addition or in the alternative, a field pulse may be applied to further improve the transfer curve, as shown in FIG. 8 which provides an example plot 80 of the magneto-resistance against the applied field when a pulsed stabilization field is applied to the sensor. In particular, the transfer curve 80 was obtained by briefly pulsing a sensor element along its easy axis immediately prior to performing a field measurement at the sensor with a sequence of field sweeps, starting with a first sweep from −5 Oe to 5 Oe, and then performing a second sweep from −10 Oe to 10 Oe, and so on. The resulting transfer curve 80 includes a region of linear characteristics 81 up to at least an applied field of approximately 20 Oe. In addition, the transfer curve 80 indicates that poor performance may be created when this sensor is exposed to a hard axis field above approximately 40 Oe. Stated more generally, a strong field applied at an arbitrary direction may put the sense element in a bad state, while a field pulse applied along the sensor easy axis is sufficient to remove domain structure from the sense element.

Figure 9:
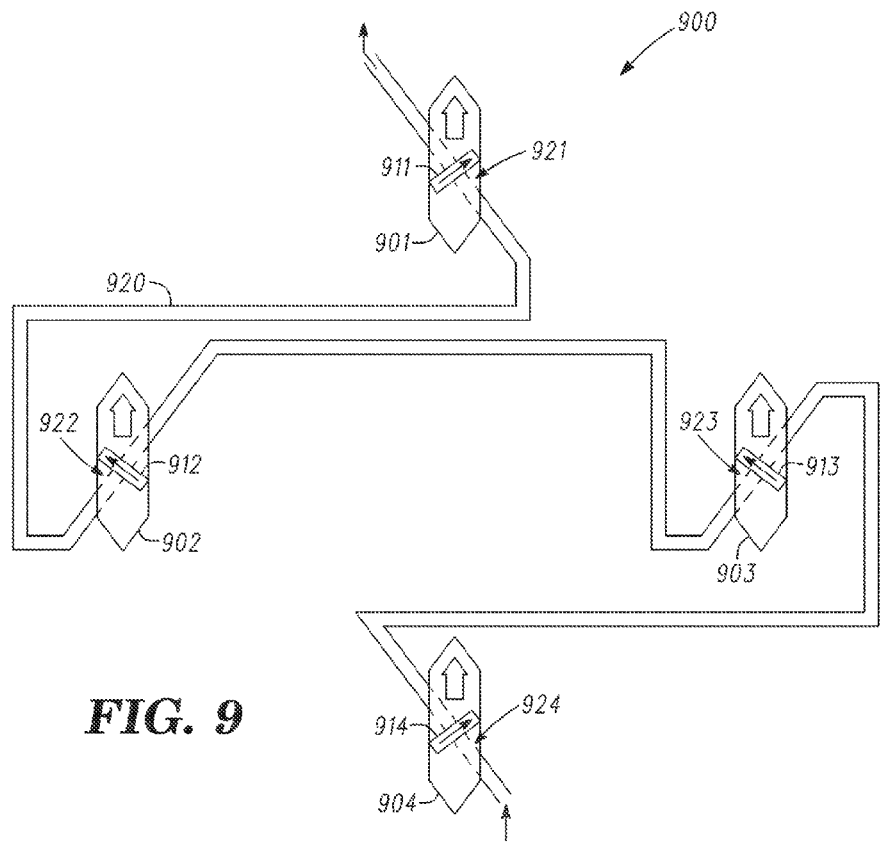
FIG. 9 is a simplified schematic top or plan view of a reticle layout showing differential sensor formed with a plurality of series-connected MTJ sensors configured in a Wheatstone bridge circuit with a magnetic field generator structure positioned in relation to the MTJ sensors.

In a practical deployment, the magnetic field generator structures 414, 424 are formed from the same layer that is necessary to interconnect the bridge legs, and hence creates no additional processing steps. In addition, each of the magnetic field generator structures 414, 424 may be constructed from a single conductive element that is positioned to pass beneath each MTJ sensor with the appropriate orientation, thereby creating field pulses throughout the chip with a single current pulse. While in a practical deployment, each bridge leg will comprise arrays of sense elements for highest Signal to Noise Ratio (SNR), a simplified example of a single sense element implementation is illustrated in FIG. 9, which provides a schematic top or plan view of a reticle layout showing differential sensor 900 formed with a plurality of series-connected MTJ sensors 921, 922, 923, 924 configured in a Wheatstone bridge circuit with a magnetic field generator structure 920 positioned in relation to the MTJ sensors. The depicted differential sensor includes four pinned layers 901, 902, 903, 904 which each have the same magnetization direction (e.g., a pinned axis in the y-direction), as shown by the large vector arrow on each pinned layer. While the pinned layers 901, 902, 903, 904 may be formed using their shape anisotropy (as indicated in FIG. 9), they may also be formed using a traditional field-anneal process.

FIG. 9 also shows that two of the MTJ sensors or sensor arrays, 921, 924 in the differential sensor are formed with sense layers 911, 914 having a magnetization direction that is oriented at 45 degrees from vertical, as shown with the easy axis vector pointing to the right in the sense layers 911, 914. The other two MTJ sensors 902, 903 are formed with sense layers 912, 913 having a magnetization direction that is oriented at negative 45 degrees from vertical, as shown with the easy axis vector pointing to the left in the sense layers 912, 913. While any desired technique may be used to form the sense layers having different magnetization directions, selected embodiments of the present invention use shape anisotropy techniques to shape the sense elements 911, 914 to have a magnetization direction (or easy axis) that is oriented at predetermined deflection angle from vertical, and to shape the sense elements 912, 913 to have a magnetization direction (or easy axis) that is oriented negatively at the predetermined deflection angle from vertical. In this way, the magnetization direction of the sense elements 911, 914 and the magnetization direction of the sense elements 912, 913 are offset equally in opposite directions from the magnetization direction of the pinned layers 901, 902, 903, 904.

The depicted differential sensor 900 also includes a magnetic field generator structure 920 which is formed beneath the MTJ sensors 921, 922, 923, 924 so as to selectively generate a magnetic field to stabilize or restore the magnetic field of the sense layers 911, 912, 913, 914. In selected embodiments, the magnetic field generator structure 920 is formed as a single conductive line which is arranged to carry current beneath the sense layers 911, 912, 913, 914 in a direction that is perpendicular to the easy axis orientation of the sense layers so that the magnetic field created by the current is aligned with the easy axis. Thus, the conductive line 920 is formed below the fourth MTJ sensor 924 to create a magnetic field that is aligned with the easy axis of the sense element 914. In addition, the orientation of the conductive line 920 below the second and third MTJ sensors 922, 923 creates a magnetic field that is aligned with the easy axis of the sense elements 912, 913. Finally, the conductive line 920 is formed below the first MTJ sensor 921 to create a magnetic field that is aligned with the easy axis of the sense element 911.

Figure 10:
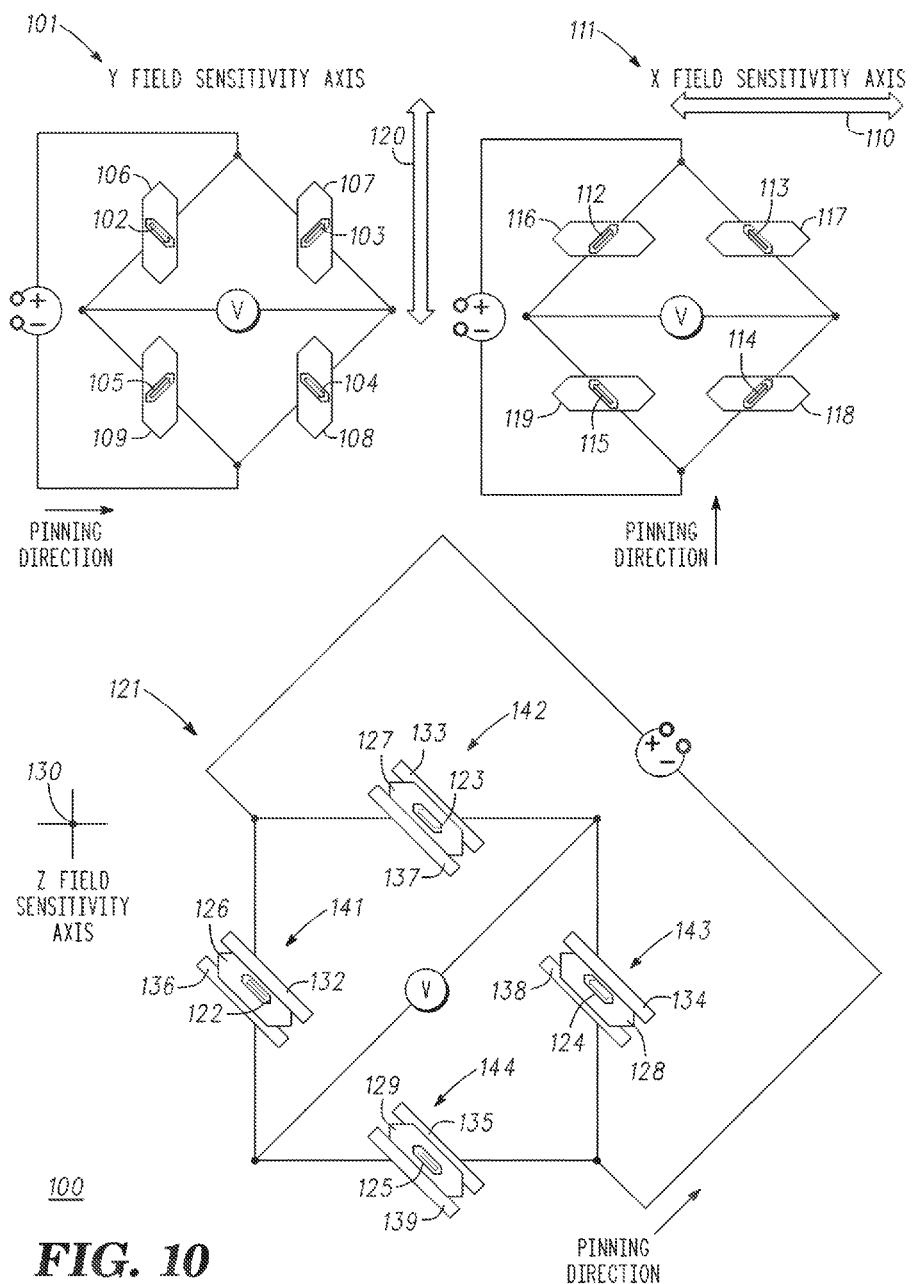
FIG. 10 is an electronic compass structure which uses differential sensors formed from three bridge structures with MTJ sensors in accordance with an exemplary embodiment.

Referring to FIG. 10, a magnetic field sensor 100 is formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 10 is situated. Exemplary embodiments of the first and second sensors 101, 111 are described in detail in U.S. patent application Ser. No. 12/433,679. As depicted herein, each sensor 101, 111, 121 is formed with unshielded sense elements that are connected in a bridge configuration. Thus, the first sensor 101 is formed from the connection of a plurality of sense elements 102, 103, 104, 105 in a bridge configuration over a corresponding plurality of pinned layers 106-109, where each of the pinned layers 106, 107, 108, 109 is magnetized in the x-axis direction. In similar fashion, the second sensor 111 is formed from the connection of a plurality of sense elements 112, 113, 114, 115 in a bridge configuration over a corresponding plurality of pinned layers 116, 117, 118, 119 that are each magnetized in the y-axis direction that is perpendicular to the magnetization direction of the pinned layers 106, 107, 108, 109. Furthermore, the third sensor 121 in the same plane as the first and second sensors 101, 111 is formed from the connection of a plurality of sense elements 122, 123, 124, 125 in a bridge configuration over a corresponding plurality of pinned layers 126, 127, 128, 129 that are each magnetized in the xy-axis direction that may be optimally orientated for the magnetic setting procedure at 45 degrees to the magnetization direction of the pinned layers 106, 107, 108, 109 and 116, 117, 118, 119. In other embodiments the third (121) sensor reference layer direction may be oriented along either x or y axis for optimal (smallest) layout of the finished three axis sensor product die. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106, 107, 108, 109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116, 117, 118, 119. In the third bridge configuration 121, the sense elements 122, 123, 124, and 125 all have an easy axis magnetization direction that is orthogonal to the pinned magnetization direction of the pinned layers 126, 127, 128, and 129. The third bridge configuration 121 further includes flux guides 132, 133, 134, 135 positioned adjacent to the right edge of sense elements 122, 123, 124, 125, and flux guides 136, 137, 138, 139 positioned adjacent to the left edge of sense elements 122, 123, 124, 125, respectively. Flux guides 132, 137, 134, and 139 are positioned above sense elements 122, 123, 124, 125, and flux guides 136, 133, 138, and 135 are positioned below sense elements 122, 123, 124, 125. The positioning of these flux guides 132, 133, 134, 135, 136, 137, 138, 139 is subsequently described in more detail in FIG. 11. In selected embodiments, the flux guides may only utilize one plane; that is only guides 136, 133, 138, and 135, or guides 132, 137, 134, and 139, may be present. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by 90 degrees for the x and y sensors, and referencing a sense element that responds in an opposite manner to an applied field in the Z direction for the Z sensor. The Z sensor referencing will be described in more detail below. The configuration shown in FIG. 10 is not required to harvest the benefits of the third sensor 121 structure described in more detail in FIG. 11, and is only given as an example.

Still referring to FIG. 10, by positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 132-139 are positioned in sensor 121 above and below the opposite edges of the elements 122-125, in an asymmetrical manner between legs 141, 143 and legs 142, 144. As flux guides 132, 134 are placed above the sense elements 122, 124, the magnetic flux from the Z field may be guided by the flux guides 132 and 134 into the xy plane along the right side and cause the magnetization of sense elements 122 and 124 to rotate in a first direction towards a higher resistance. Similarly, the magnetic flux from the Z field may be guided by the flux guides 133 and 135 into the xy plane along the right side of the sense element and cause the magnetization of sense elements 123 and 125 to rotate in a second direction, opposite from the first direction towards a lower resistance, as these flux guides are located below the sense elements 123, 125. Thus, the sensor 121 can detect the component directions of an applied field along the third axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. Each of the pinned layers 106-109, 116-119, and 126-129 may be formed with one or more lower ferromagnetic layers, and each of the sense elements 102-105, 112-125, 122-125 may be formed with one or more upper ferromagnetic layers. An insulating tunneling dielectric layer (not shown) may be disposed between the sense elements 102-105, 112-125, 122-125 and the pinned layers 106-109, 116-119, and 126-129. The pinned and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, pinned layers 106-109, 116-119, and 126-129 may be formed with one or more layers of ferromagnetic and antiferromagnetic materials to a combined thickness in the range 10 to 1000 Å, and in selected embodiments in the range 250 to 350 Å. In an exemplary implementation, each of the pinned layers 106-109, 116-119, and 126-129 is formed with a single ferromagnetic layer and an underlying anti-ferromagnetic pinning layer. In another exemplary implementation, each pinned layer 106-109, 116-119, and 126-129 includes a synthetic anti-ferromagnetic stack component (e.g., a stack of CF (Cobalt Iron), Ruthenium (Ru) and CFB) which is 20 to 80 Å thick, and an underlying anti-ferromagnetic pinning layer that is approximately 200 Å thick. The lower anti-ferromagnetic pinning materials may be re-settable materials, such as IrMn, though other materials, such as PtMn, can be used which are not readily re-set at reasonable temperatures. As formed, the pinned layers 106-109, 116-119, and 126-129 function as a fixed or pinned magnetic layer when the direction of its magnetization is pinned in one direction that does not change during normal operating conditions. As disclosed herein, the heating qualities of the materials used to pin the pinned layers 106-109, 116-119, and 126-129 can change the fabrication sequence used to form these layers.

One of each of the sense elements 102-105, 112-125, 122-125 and one of each of the pinned layers 106-109, 116-119, 126-129 form a magnetic tunnel junction (MTJ) sensor. For example, for bridge circuit 121, sense element 122 and pinned layer 126 form an MTJ sensor 141. Likewise, sense element 123 and pinned layer 127 form an MTJ sensor 142, sense element 124 and pinned layer 128 form an MTJ sensor 143, and sense element 125 and pinned layer 129 form an MTJ sensor 144.

The pinned layers 106-109, 116-119, and 126-129 may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-125, 122-125 may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the sense elements 102-105, 112-125, 122-125 function as a sense layer or free magnetic layer because the direction of their magnetization can be deflected by the presence of an external applied field, such as the Earth's magnetic field. As finally formed, sense elements 102-105, 112-125, 122-125 may be formed with a single ferromagnetic layer having a magnetization direction (indicated with the arrows) that aligns along the long-axis of the patterned shapes.

The pinned layers 106-109, 116-119, 126-129 and sense elements 102-105, 112-125, 122-125 may be formed to have different magnetic properties. For example, the pinned layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-125, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

The pinned layers 106-109, 116-119, 126-129 in the MTJ sensors are formed to have a shape determined magnetization direction in the plane of the pinned layers 106-109, 116-119, 126-129 (identified by the vector arrows for each sensor bridge labeled "Pinning direction" in FIG. 1). As described herein, the magnetization direction for the pinned layers 106-109, 116-119, 126-129 may be obtained using shape anisotropy of the pinned electrodes, in which case the shapes of the pinned layers 106-109, 116-119, 126-129 may each be longer in the pinning direction for a single pinned layer. Alternatively, for a pinned SAF structure, the reference and pinned layers may be shorter along the pinning direction. In particular, the magnetization direction for the pinned layers 106-109, 116-119, 126-129 may be obtained by first heating the shaped pinned layers 106-109, 116-119, 126-129 in the presence of a orienting magnetic field which is oriented non-orthogonally to the axis of longest orientation for the shaped pinned layers 106-109, 116-119, 126-129 such that the applied orienting field includes a field component in the direction of the desired pinning direction for the pinned layers 106-109, 116-119, 126-129. The magnetization directions of the pinned layers are aligned, at least temporarily, in a predetermined direction. However, by appropriately heating the pinned layers during this treatment, and removing the orienting field, and then further heating above the phase transition temperature of the pinning anti-ferromagnetic material, the magnetization of the pinned layers relaxes along the desired axis of orientation for the shaped pinned pinned layers 106-109, 116-119, 126-129. Once the magnetization relaxes, the pinned layers can be annealed and/or cooled so that the magnetic field direction of the pinned electrode layers is set in the desired direction for the shaped pinned layers 106-109, 116-119, 126-129.

Figure 11:
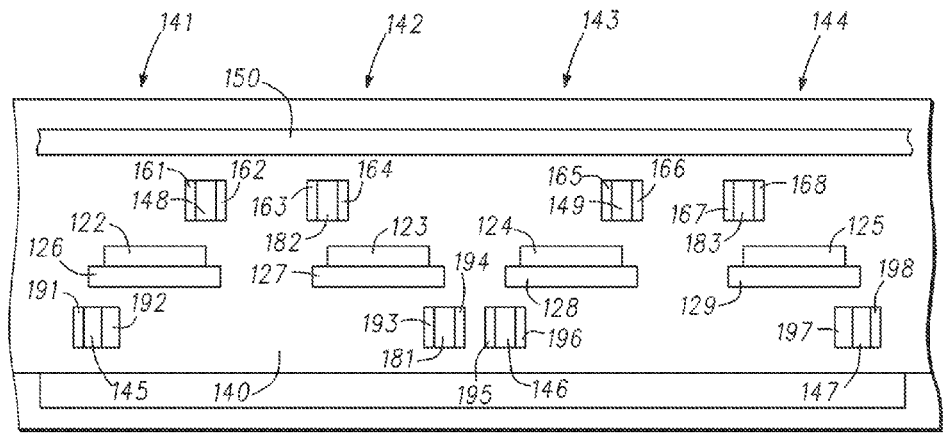
FIG. 11 is a partial cross section of the Z axis bridge structure of FIG. 10 in accordance with another exemplary embodiment.

The MTJ sensors (141-144) and the flux guide placement within sensor 121 (FIG. 10) are now further described. Referring to FIG. 11, the structure of the MTJ devices 141-144 of the third bridge circuit 121 includes the cladded lines 145-149 divided into two independent metal lines, and additional non-flux guiding cladding (161-168 and 191-198) is placed in between these two metal lines at the interior edges, all formed within the dielectric material 140. For sensor 141, the flux guide 161 on the left edge of the left metal line, 148 guides Z field flux into the sense element 122 to its left, and the flux guide 192 on the right most edge of the right metal line 145 guides Z field flux into the sense element 122 on its right. Sensors 142-144 function similarly, with the cladded edge of the metal line adjacent to each sense element serving the active flux guiding function. As these lines are separated, a current may be made to pass through cladded lines 145, 146, 182 and 183 into the page, and 181, 147, 148, and 149 out of the page to create a magnetic field along the cladded line edges with a Z component pointing in a consistent direction (down in this example). These current orientations can serve to create a magnetic field with a strong component in the Z direction, which, through a calibration for the geometry can serve as a self test for the functionality and sensitivity of the Z axis response. The lines 145-149, 181-183 are preferably copper, but in some embodiments may be a dielectric. A metal stabilization line 150 is positioned above the MTJ devices 141-144 for providing a stabilization field to the sense elements. The ends of the flux guides may be brought as close as possible to the sensor elements, with a preferable spacing of less than or equal to 250 nm between the two. The sense elements are brought as close as possible for the tightest density array, preferably less than 2.5 um apart.

Figure 12:
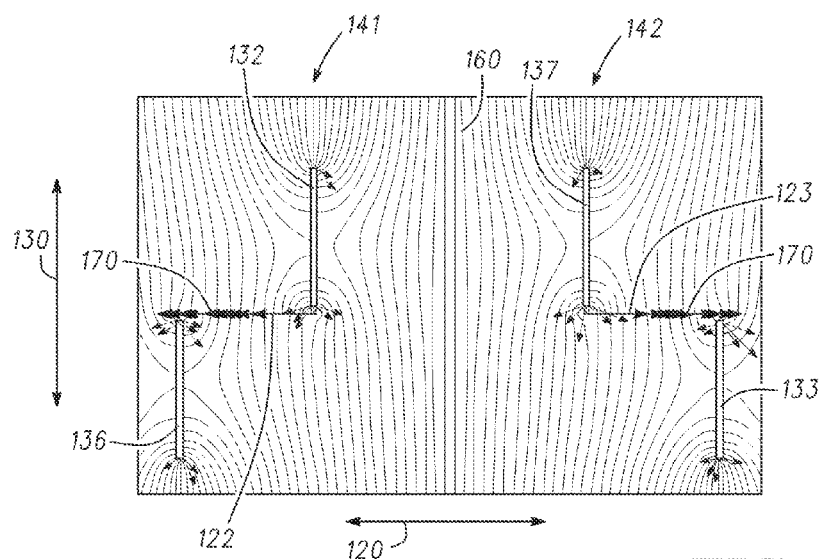
FIG. 12 is a view of flux lines as calculated by finite element simulation of two of the four magnetic tunnel junction sensors of FIG. 11.

FIG. 12 is a view of flux lines as calculated by finite element simulation of MTJ devices 141, 142 of FIG. 11 with a magnetic field in the z direction imparted upon the sense elements 122-123. FEM modeling shows the resultant magnetic flux lines 160, exhibiting a component in the plane of the sensor. MTJ device 141 is represented by flux guides 132 and 136 on opposed ends of the sensing element 122. MTJ device 142 is represented by flux guides 133 and 137 on opposed ends of the sensing element 123. Stated otherwise, sensing element 122 extends from flux guides 132 and 136, and sensing element 123 extends from flux guides 133 and 137. The magnetic field 160 in the Z-axis 130 produces an asymmetric response in the sensing elements 122, 123 along the X-axis 120 as indicated by the arrows 170. In this manner, for a field 160 in the Z direction 130 directed towards the bottom of the page, the magnetization of sense element 122 rotates away from the pinning direction (and to higher resistance) of the pinned layer 126, while the magnetization of sense element 123 rotates towards the pinning direction (and to lower resistance) of pinned layer 127. For a field in the X direction 120, both elements 122, 123 show induced magnetization in the same direction (towards higher or lower resistance). Therefore, by wiring MTJ elements 141, 142 in a Wheatstone bridge for differential measurement and subtracting the resistances of MTJ devices 141, 142, the X field response is eliminated and twice the Z field response is measured.

Referring again to FIG. 11, self test lines 145-149 are implemented as conductive lines extending into the page (perpendicular to the stabilization line 150). For example, self test line 145 (Cu filled flux guide trench) is positioned below sense element 122. A hard axis field is created by applying a current through the self test lines 145-149 during reset (while a reset current is applied to the stabilization line 150). As is well known in the art, this field, when applied together with the reset/stabilization field by 150, lowers the threshold for the easy axis switching per Stoner Wolforth astroid, and therefore, can effectively increase the effect of the stabilization or reset field, i.e. reduce the threshold field from the stabilization line 150 with which the sensing element may be reset. The self test line may be routed in other layers; e.g., above or below the flux guide or tunnel junction, and hence this hard axis assist field may come from current through lines other than directly through the flux guide.

Figure 13:
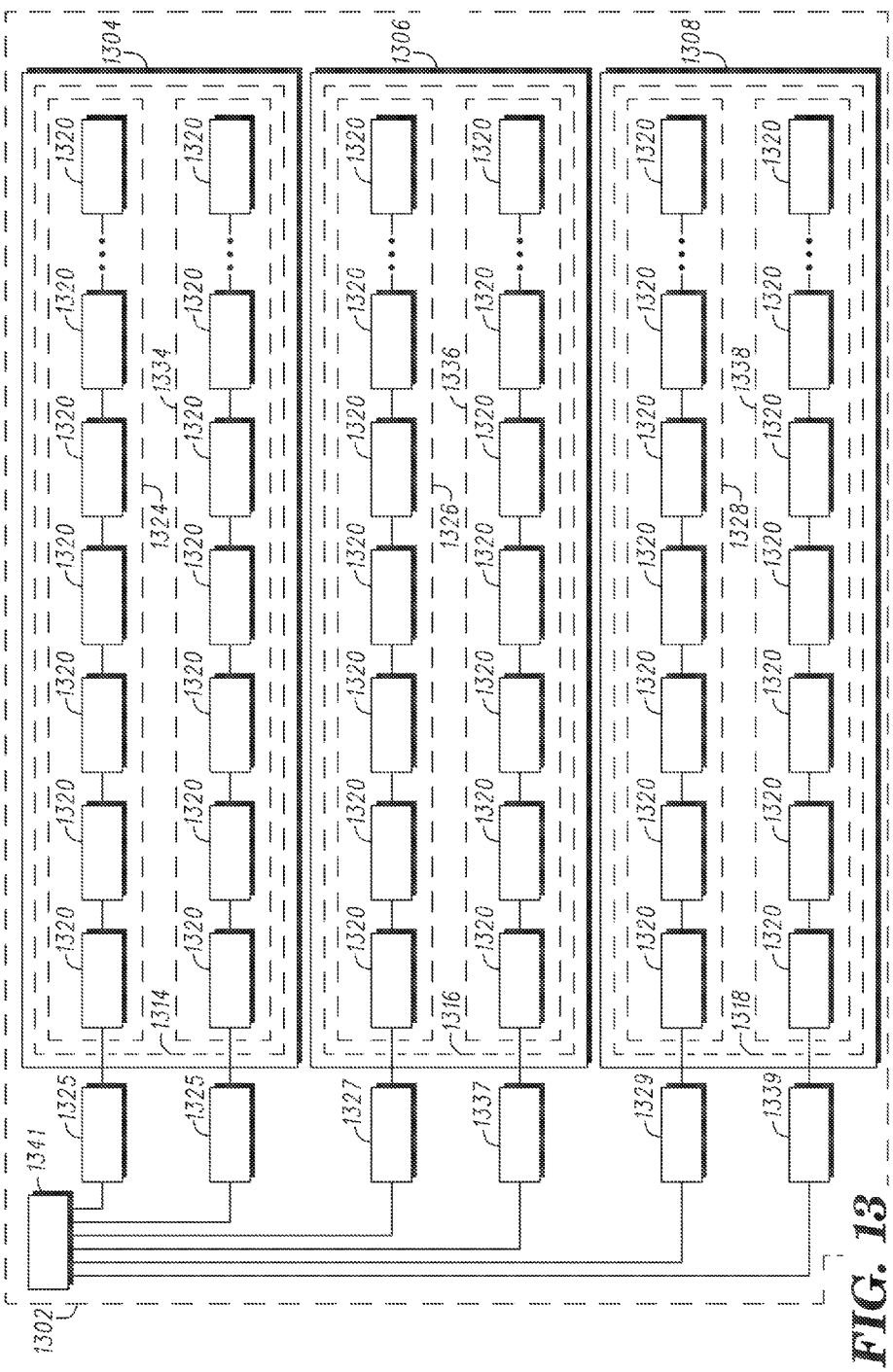
FIG. 13 is a partial block diagram of three Wheatstone bridges configured to receive sequential application of reset pulses for resetting a plurality of MTJ sensors within each bridge.

Referring to FIG. 13, a block diagram of an integrated magnetic sensor 1302 includes the Wheatstone bridge 1304 for sensing a magnetic field in an X direction, a Wheatstone bridge 1306 for sensing a magnetic field in a Y direction, and a Wheatstone bridge 1308 for sensing a magnetic field in a Z direction. While three Wheatstone bridges 1304, 1306, 1308 are shown for sensing a field in three dimensions, it is understood that only one Wheatstone bridge may be formed for sensing a field in one dimension, or two Wheatstone bridges may be formed for sensing a field in two dimensions. One example of a structure for sensing a magnetic field in three dimensions may be found in U.S. patent application Ser. No. 12/567,496. The Wheatstone bridge 1304 includes a first plurality of magnetic sense elements 1314, including a first group 1324 and a second group 1334. Likewise, Wheatstone bridge 1306 includes a first plurality of magnetic sense elements 1316, including a first group 1326 and a second group 1336, and Wheatstone bridge 1308 includes a first plurality of magnetic sense elements 1318, including a first group 1328 and a second group 1338. While two groups are shown in each of the Wheatstone bridges 1304, 1306, 1308, any number of groups numbering two or more may be utilized. For example, the plurality of magnetic sense elements 1314 may comprise i magnetic sense elements, the plurality of magnetic sense elements 1316 may comprise j magnetic sense elements, and the plurality of magnetic sense elements 1318 may comprise k magnetic sense elements. Each of the magnetic sense elements 1320 within each of the plurality of magnetic sense elements 1314, 1316, 1318 comprises a magnetic sense element such as MTJ sensors 410, 420 of FIGS. 4 and 5. A write driver 1325 is configured to provide a current pulse to each of the MTJ elements within the group 1324 and a write driver 1335 is configured to subsequently provide a current pulse to each of the MTJ elements within the group 1334. Likewise, a write driver 1327 is configured to provide a current pulse to each of the MTJ elements within the group 1326 and a write driver 1337 is configured to provide a current pulse to each of the MTJ elements within the group 1336, and a write driver 1329 is configured to provide a sequential current pulse to each of the MTJ elements within the group 1328 and a write driver 1339 is configured to provide a sequential current pulse to each of the MTJ elements within the group 1338.

Logic circuit 1341 sequentially selects write drivers 1325, 1335, 1327, 1337, 1329, 1339, for sequentially providing a reset current pulse to the groups 1324, 1334, 1326, 1336, 1328, 1338, respectively. Since a given voltage is provided, by dividing a reset current line having a large resistance into several reset current line segments each having a smaller resistance, a larger current may be applied to each group of MTJ elements in the groups 1324, 1334, 1326, 1336, 1328, 1338. Also, the reset pulses will be sequential, and a smaller stabilization current will be applied during the measurement. This stabilization current will flow through the entire line and stabilize all sense elements with an identical stabilization field since the voltage is high enough to supply the required stabilization line over the full line resistance. This embodiment is preferred as power consumption is lowest and small differences in stabilization line resistances will not result in different stabilization fields. However, for higher SNR ratios than are attainable given this stabilization configuration, stabilization current may be applied to different sub groupings of the array in parallel, allowing the possibility of additional stabilization paths (and hence sense element array size increases) within a given sensor.

Figure 14:
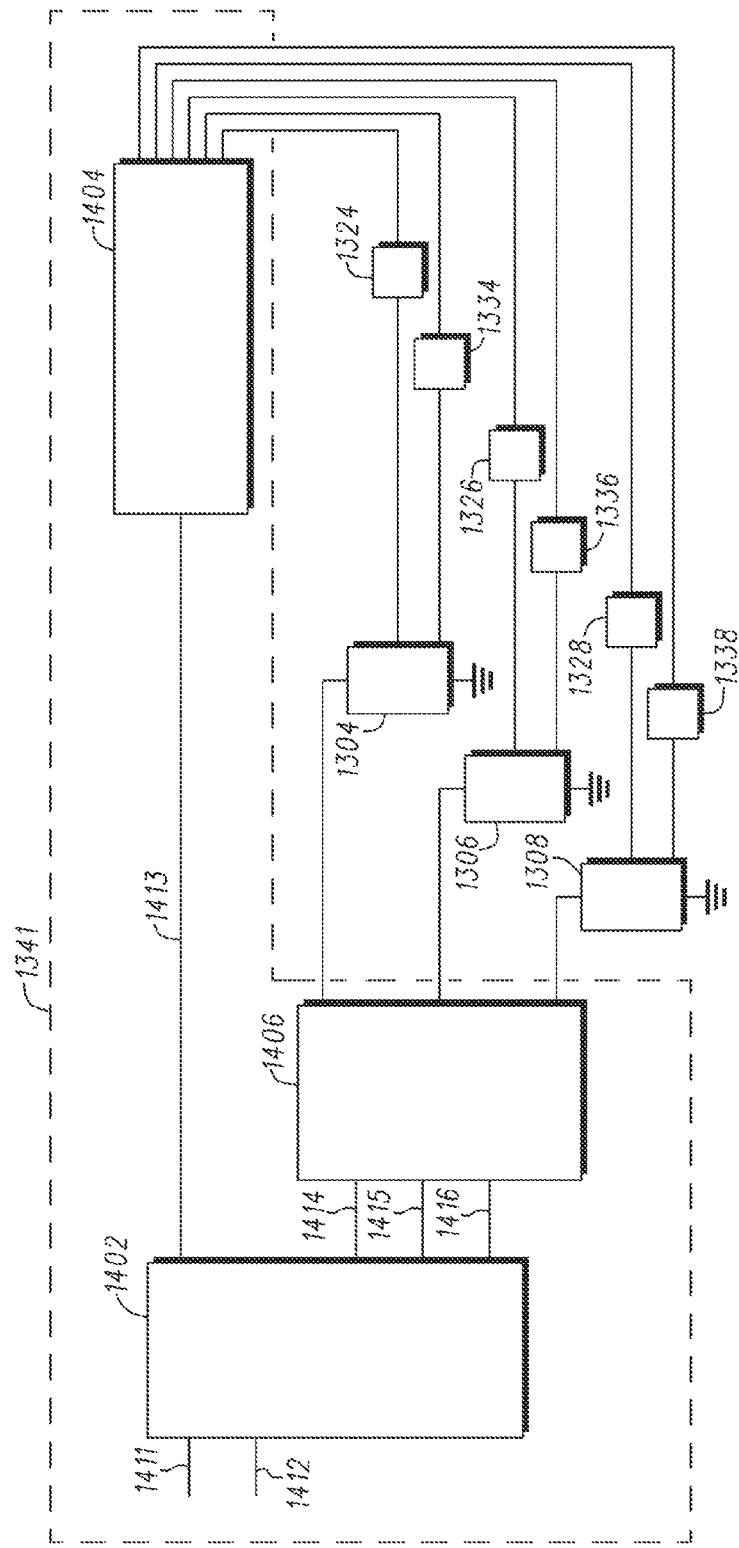
FIG. 14 is a partial block diagram of another three Wheatstone bridges configured to receive sequential resetting pulses for resetting a plurality of MTJ sensors within each bridge and sensing a magnetic field.

The logic circuit 1341 is further described in FIG. 14 and includes a state decoder 1402, a reset circuit 1404, and a read bridge select circuit 1406. Input signals 1411 and 1412 dictate one of four output signals 1413, 1414, 1415, 1416. Output signal 1413 activates the reset circuit 1404 for sequentially activating each of the drivers 1325, 1335, 1327, 1337, 1329, 1339. Output signals 1114, 1115, 1116 activate a read sequence of each of the Wheatstone bridges 1304, 1306, 1308.

Figure 15:
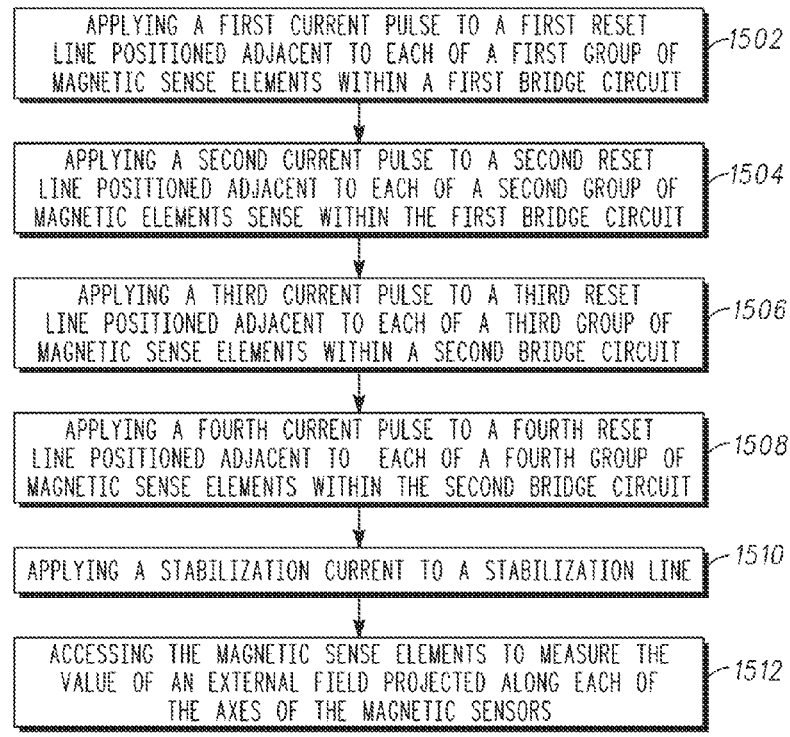
FIG. 15 is a flow chart showing a method of sequentially resetting the MTJ field sensors which may be used to provide initialize magnetic field sensing elements.

Operation of the magnetic sensors described herein may also be illustrated with reference to FIG. 15, which depicts an exemplary flowchart for a method of operation of magnetic field sensors which do not exhibit micro-magnetic structure by resetting the magnetic sense elements prior to or just after sensing of an external magnetic field. While two bridge circuits are described, it is understood that any number of bridge circuits may be utilized. This resetting, or initializing, includes the steps of applying 1502 a first current pulse to a first reset line positioned adjacent each of a first group of magnetic sense elements within a first bridge circuit, applying 1504 a second current pulse to a second reset line positioned adjacent each of a second group of magnetic sense elements within the first bridge circuit, applying 1506 a third current pulse to a third reset line positioned adjacent each of a third group of magnetic sense elements within a second bridge circuit, and applying 1508 a fourth current pulse to a fourth reset line positioned adjacent each of a fourth group of magnetic sense elements within the second bridge circuit. A stabilization current is applied 1510 to the stabilization line. The magnetic sense elements are then accessed 1512 to measure a value of an external field projected along each of the sensor axes of the magnetic sense elements.

Figure 16:
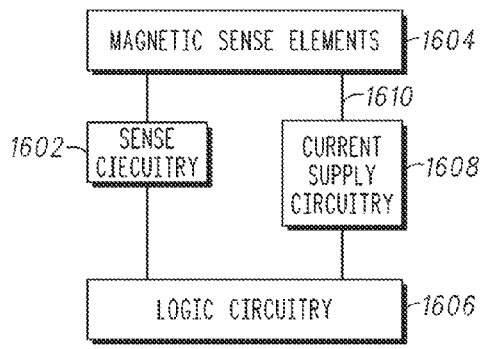
FIG. 16 is a block diagram of the logic circuit for performing the methods in accordance with the exemplary embodiments.

In accordance with the methods of implementing the exemplary embodiments described herein, FIG. 16 is a block diagram including sense circuitry 1702 coupled to a plurality of magnetic sense elements 1604 for sensing an external magnetic field. Logic circuitry 1606 is coupled to the sense circuitry 1602 for determining a component of the external magnetic field, the component being aligned with the field that is created when a current is passed through the reset/stabilization current line 1610. In response to the logic circuit 1606, the current supply circuitry 1608 supplies the reset and stabilization currents to the current line 1610 adjacent the magnetic sense elements 1604.

As the reset and stabilization fields act primarily along the magnetic sense element easy (long) axis in order to properly orient and stabilize the sense element for measurement, but the sense element magnetization deflects from the easy axis in response to a field along the sense element hard (short) axis, a single axis sensor cannot independently determine the field component that needs to be taken into account in achieve the proper net stabilization and reset field. Accordingly, a dual axis sensor is utilized wherein the orthogonal axis determines the component of the external field that lies along the given sense axis' hard axis. For example the field measured by the Y axis sensor is utilized to measure the external field component and to determine the optimal stabilization and reset field that may be supplied to the X axis sensor in its operation. Similarly, the X axis sensor signal is utilized to determine the stabilization and reset field required to optimally operate the Y axis sensor during measurement. In the case of a non-orthogonal offset between the sense element easy axis and the reference layer magnetization angle, a combination of the measurements from each X and Y axis may be utilized to determine the optimal stabilization and reset fields as the projection of the X or Y field on the sense elements of the Y or X sensor, respectively is non zero as there are different non-orthogonal sense element orientations within a given sensor bridge for detection along a single axis. In this case, the reset and stabilization currents may be different values for different orientation elements within a given axis. For sensors responding to out of plane fields (Z axis sensors) the sense elements themselves are stabilized with in plane fields and therefore it is the in plane component of an external field along the sense element easy axis which must be optimized for sensor operation. Hence, the signal from the X sensor, Y sensor, or some combination thereof is utilized to determine the optimal stabilization and reset field for Z axis operation during measurement.

Figure 17:
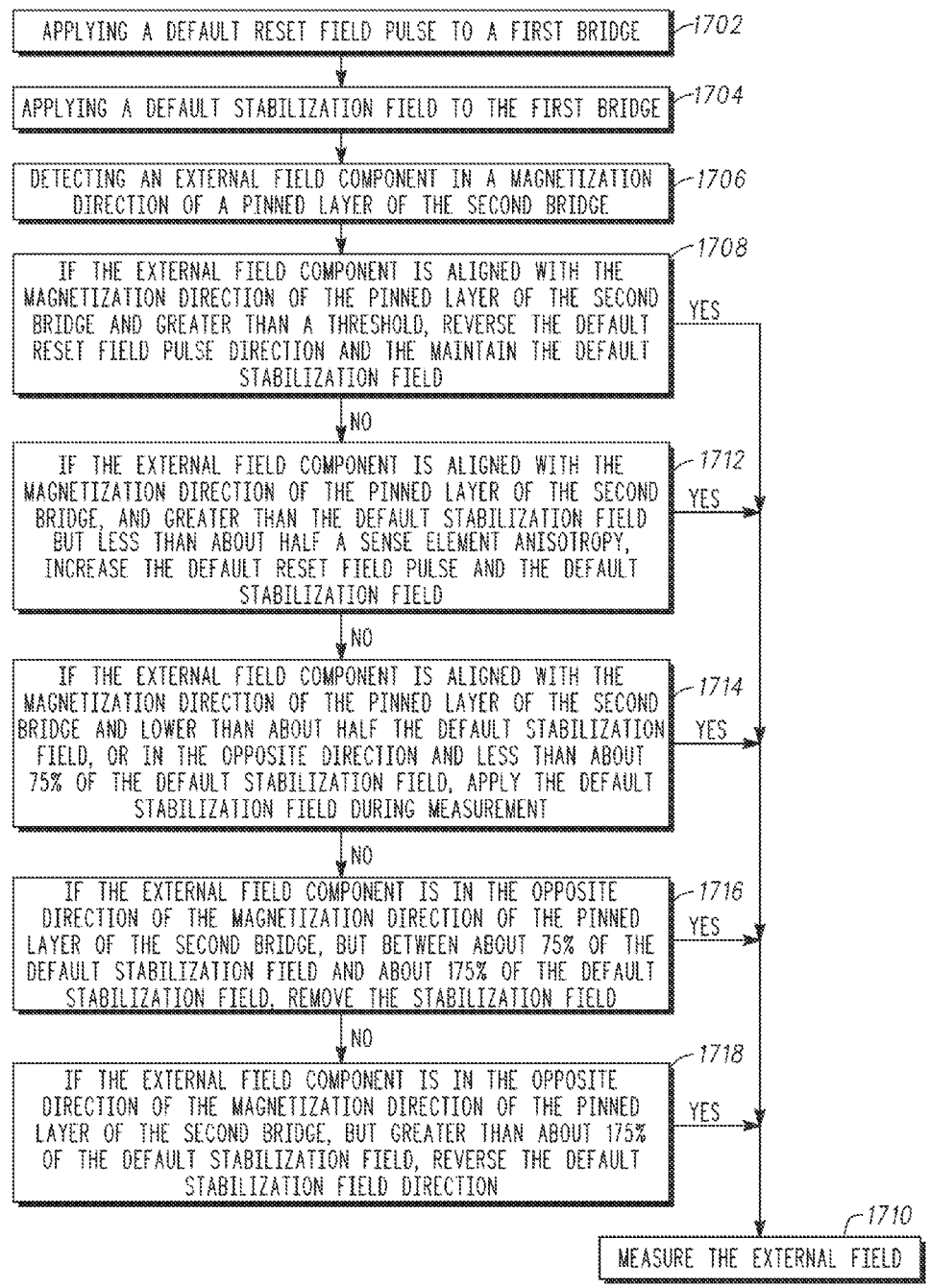
FIG. 17 is a flowchart showing a first exemplary method for reset and stabilization control of a magnetic sensor utilizing a non-orthogonal offset between sense element easy axes and the reference layer magnetization angle.

Referring to FIG. 17, a first exemplary method for reset and stabilization control of a magnetic sensor utilizing a non-orthogonal offset between sense element easy axis and reference layer magnetization angle includes applying 1702 a default reset field pulse to a first plurality of magnetic sense elements in a first bridge, applying 1704 a default stabilization field to the first plurality of magnetic sense elements of the first bridge, detecting 1706 an external field component along the magnetization direction of a pinned layer in the second bridge as sensed by the magnetic sense elements of the first bridge. The measured values are used to change the default stabilization current and reset current pulse that operate the second bridge which detects field components along a different sense axis. If the external field component is aligned with the magnetization direction of the pinned layer in the second bridge and greater than a threshold (approaching the sense element anisotropy), the default reset field pulse direction is reversed 1708 and the stabilization field is applied at the original magnitude. The reset field pulse is issued and a measurement of the external field is taken 1710 with the default stabilization field on. Reversing the sense element orientation from its original design direction of approximately 135 degrees from the pinned layer magnetization reduces the sensitivity, but also reduces cross axis effects and allows a low power measurement. If the measured external field component is aligned with the magnetization of the pinned layer in the second bridge, greater than the default stabilization field but less than about half the sense element anisotropy, both the default reset field pulse and the default stabilization field for the second bridge are increased 1712, but kept in the same polarity wherein they are opposite to the pinned layer magnetization. A measurement with the second bridge is now taken 1710 with the newly determined reset field pulse and stabilization field amplitudes. This suppresses cross axis effects, keeps the sensor in a higher sensitivity state, but uses more power to perform the measurement. If the external field component is aligned with the magnetization of the pinned layer in the second bridge and lower than about half the default stabilization field, or opposite to the magnetization of the pinned layer in the second bridge but less than about 75% of the default stabilization field, the default stabilization values are used 1714 for a measurement with the second bridge. If the measured external field component is opposite to the magnetization of the pinned layer in the second bridge, but between about 75% of the default stabilization field and about 175% of the default stabilization field, the default reset field pulse polarity is kept in the default direction, and the stabilization field may be turned off 1716 during measurement with the second bridge. The external field is then used as the stabilization field. This allows for a higher sensitivity and lower power measurement. If the measured external field component is opposite to the magnetization of the pinned layer in the second bridge, but greater than about 175% of the default stabilization field, then the default stabilization field polarity is reversed 1718, partially cancelling out the external field component and operating the sensor at a maximal sensitivity. For a multi-axis system, the operating conditions of each sense axis may be independently determined, depending upon the projection of the external field upon the initial stabilization fields of each axis. This determination of the optimal sensor reset and stabilization configuration need only take place infrequently—perhaps even as infrequently as only once after the sensor has been integrated into the final system (Cell Phone, GPS, Camera, etc.).

Figure 18:
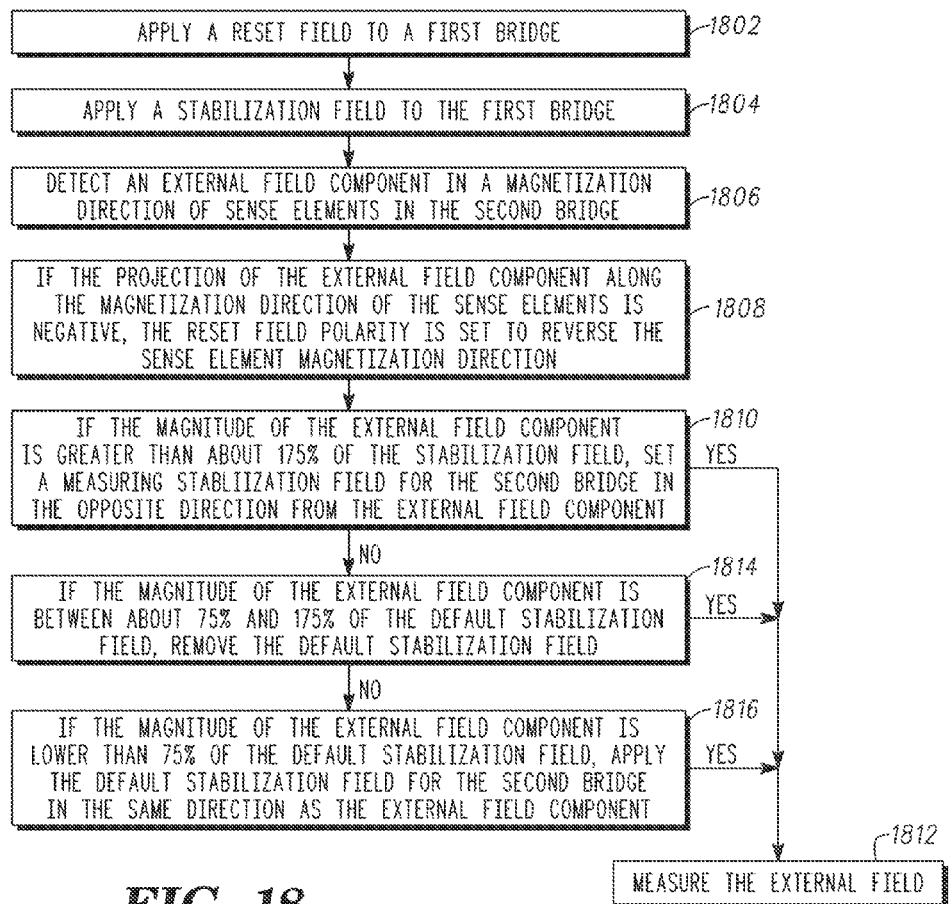
FIG. 18 is a flowchart showing a exemplary method for reset and stabilization control of a magnetic sensor with a 90 degree orientation between sense element easy axis and the reference layer magnetization angle.

A second exemplary method (FIG. 18), which applies to sensors with a 90 degree orientation between sense element easy axis and reference layer axis includes applying 1802 a first reset field pulse to orient the sense elements in a first bridge which measures the field along a first axis, applying 1804 a first stabilization field to a plurality of magnetic sense elements in a first bridge, and determining 1806 the projection of an external field along the magnetization direction (easy axis) of the sense elements in a second bridge, as sensed by the sense elements of the first bridge. The measured values are used to change the default second stabilization current and reset current pulse that operate a second bridge which detects field components along a different sense axis. If the projection of the external field component along the magnetization direction of the sense elements is negative, the reset field pulse polarity is set to reverse 1808 the magnetization direction. If the magnitude of the external field component is greater than about 175% of the default stabilization field, the stabilization field for the second sensor is sourced 1812 in the opposite direction from the external field component to reduce the net field acting on the sense elements, thereby increasing the sensor sensitivity. If the magnitude of the external field component is between about 75% and 175% of the default stabilization field, the stabilization field is turned off 1814 during measurement, allowing the external field to serve as the stabilization field, and thereby lowering sensor power consumption and increasing sensitivity over what it would have been had the stabilization field been kept constant. If the magnitude of the external field component is lower than about 75% of the default stabilization field, the stabilization field is applied 1816 in the same direction as the external field to ensure that sufficient stabilization field is present of linear sensor operation. Once the reset field pulse and stabilization field polarities are determined, the sense elements are subsequently reset with the newly determined reset field pulse, and the previously determined stabilization field values are applied so as to take the sensor measurement under optimal conditions. For a multi-axis system, the operating conditions of each sense axis may be independently determined, depending upon the projection of the external field upon the initial stabilization fields of each axis. This determination of the optimal sensor reset and stabilization configuration need only take place infrequently—perhaps even as infrequently as only once after the sensor has been integrated into the final system (Cell Phone, GPS, Camera, etc.).

Alternatively a continuous adjustment of the stabilization current and reset pulse height may be utilized. In this case, a predetermined optimal net stabilization field—the combination of the external field and the local stabilization field which may be provided from the on chip stabilization current lines—may be targeted for optimal sensor response. The stabilization current applied during operation may be adjusted continuously throughout a range for each axis such that the net stabilization field at the sense element array is the desired predetermined value. Similarly, the reset field pulse may be continuously adjusted so that the net reset field achieves a predetermined value.

Figure 19:
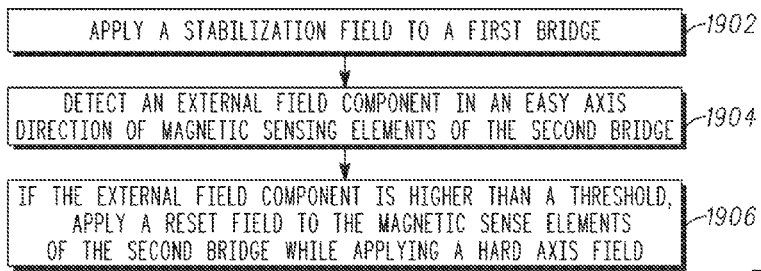
FIG. 19 is a flowchart showing a third exemplary method for reset and stabilization control of a magnetic sensor.

Referring to FIG. 19, a third exemplary method includes applying 1902 a stabilization field to a plurality of magnetic sense elements of a first bridge, and detecting 1904 an external field component in the easy axis direction of the magnetic sensing elements of the second bridge. If the external field component is higher than a threshold, the switching threshold for the magnetic sense elements of the second bridge is lowered via resetting 1906 the magnetic sense elements of the second bridge by applying a reset field pulse while simultaneously applying a hard axis field originated from a current carrying line that is routed at an angle (preferably orthogonal) to the reset line orientation of the sensing elements of the second bridge.

In yet another exemplary embodiment, a method for measuring an ambient magnetic field with a multi-axis magnetic field sensor having a plurality of magnetic sense elements comprises performing an initial measurement using default magnitudes of a first plurality of reset field pulses and a first plurality of stabilization fields applied to the magnetic sense elements; determining adjusted magnitudes of a second plurality of reset field pulses and a second plurality of stabilization fields based on the initial measurement; performing a second measurement while applying the adjusted magnitudes for the second plurality of reset field pulses and the second plurality of stabilization fields applied to the magnetic sense elements; and providing output signals representing the response of the second measurement.

In the abovementioned exemplary methods, the application of the first reset field and first stabilization field to the first bridge are described to orient and stabilize the sense elements in the first bridge. They are to provide a more accurate determination of the external field component along the first axis. However, these steps can be optional.

By now it should be appreciated that there has been provided a magnetic field sensor apparatus and a method of operating a plurality of differential sensor circuits over a substrate which detects an applied magnetic field directed along one or more axis. The differential sensor circuits may be constructed as Wheatstone bridge structures, one for each axis to be sensed, of unshielded magnetic tunnel junction (MTJ) sensors formed with a plurality of pinned layers that are each magnetized in a single pinned direction and a corresponding plurality of unshielded sense layers. In order to nullify the impact of an external field conflicting with the reset and stabilization field, a first stabilization current is applied to a current line adjacent the magnetic sense elements and an external field component aligned with a stabilization field created by the first stabilization current is measured. A magnitude and direction of at least one of a reset current pulse and a second stabilization current (that produces a reset field pulse and a second stabilization field, respectively) is determined that, when applied to the magnetic sense elements, minimizes this total required stabilization field and reset field pulse during the operation of the magnetic sensor and the measurement of the external field. Therefore the low field sensor operates optimally (with the highest sensitivity and the lowest power consumption) around the fixed external field operating point. The fixed external field is created by other components in the sensor device housing (such as speaker magnets) which have a high but static field with respect to the low (earth's) magnetic field that describes orientation information.

Although the described exemplary embodiments disclosed herein are directed to various sensor structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may vary. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for operating a plurality of magnetic sense elements, the method comprising:
    applying a first reset field pulse to orient a plurality of magnetic sense elements in a first group of a first bridge circuit, the first bridge circuit configured to sense an external magnetic field along a first sense axis;
    applying a first stabilization field to the plurality of magnetic sense elements in the first group of the first bridge circuit;
    determining a component of an external field in a first direction as sensed by the plurality of magnetic sense elements in the first group of the first bridge circuit, wherein the first direction is a reference layer magnetization direction of a second bridge circuit that is configured to sense an external magnetic field along a second sense axis that is orthogonal to the first sense axis;

determining, based on the determined component of the external field, a magnitude of a second reset field pulse and of a second stabilization field as compared to a default stabilization field;

applying at least one of (i) the second reset field pulse to a plurality of magnetic sense elements in a second group of the second bridge circuit prior to measuring a direction and magnitude of an external field, and (ii) the second stabilization field while measuring a direction and magnitude of an external field utilizing the plurality of magnetic sense elements of the second group of the second bridge circuit; and measuring a direction and magnitude of an external field utilizing the plurality of magnetic sense elements of the second group of the second bridge circuit.

2. The method of claim 1, wherein applying at least one of (i) the second reset field pulse to a plurality of magnetic sense elements in a second group of the second bridge circuit prior to measuring the direction and magnitude of the external field, and (ii) the second stabilization field while measuring the direction and magnitude of the external field utilizing the plurality of magnetic sense elements of the second group of the second bridge circuit comprises:

applying the second reset field pulse in a direction opposed to a direction of the default stabilization field if the determined component of the external field is in an opposite direction of the default stabilization field and greater than at least one of 175% of the default stabilization field and (ii) half a sense element anisotropy; and applying the second stabilization field that is approximately the same as the default stabilization field.

3. The method of claim 1, wherein applying the second reset field pulse to a plurality of magnetic sense elements in a second group of the second bridge circuit prior to measuring the direction and magnitude of the external field comprises:

applying the second reset field pulse in a direction opposed to a direction of the default stabilization field if the determined component of the external field is in an opposite direction of the default stabilization field and between 75% to 175% of the default stabilization field.

4. The method of claim 1, wherein applying at least one of (i) the second reset field pulse to a plurality of magnetic sense elements in a second group of the second bridge circuit prior to measuring the direction and magnitude of the external field, and (ii) the second stabilization field while measuring the direction and magnitude of the external field utilizing the plurality of magnetic sense elements of the second group of the second bridge circuit comprises:

applying the second reset field pulse in a direction opposed to a direction of the default stabilization field if the determined component of the external field is in an opposite direction of the default stabilization field and less than 75% of the default stabilization field; and applying the second stabilization field in the opposite direction of the default stabilization field and with a same magnitude of the default stabilization field.

5. The method of claim 1, wherein applying at least one of (i) the second reset field pulse to a plurality of magnetic sense elements in a second group of the second bridge circuit prior to measuring the direction and magnitude of the external field, and (ii) the second stabilization field while measuring the direction and magnitude of the external field utilizing the plurality of magnetic sense elements of the second group of the second bridge circuit comprises:

applying the second reset field pulse in a direction of the default stabilization field if the determined component of the external field is in a same direction as the default stabilization field and greater than 175% of the default stabilization field; and applying a second stabilization field that has a same magnitude as the default stabilization field and an opposite direction to the default stabilization field.

6. The method of claim 1, wherein applying the second reset field pulse to a plurality of magnetic sense elements in a second group of the second bridge circuit prior to measuring the direction and magnitude of the external field comprises:

applying the second reset field pulse in a same direction as the default stabilization field if the determined component of the external field is in a same direction of the default stabilization field and between 75% to 175% of the default stabilization field.

7. The method of claim 1, wherein applying at least one of (i) the second reset field pulse to a plurality of magnetic sense elements in a second group of the second bridge circuit prior to measuring the direction and magnitude of the external field, and (ii) the second stabilization field while measuring the direction and magnitude of the external field utilizing the plurality of magnetic sense elements of the second group of the second bridge circuit comprises:

applying the second reset field pulse in a same direction as the default stabilization field if the determined component of the external field is in a same direction as the default stabilization field and less than 75% of the default stabilization field; and applying the second stabilization field that is the same as the default stabilization field.

8. The method of claim 1, wherein applying at least one of (i) the second reset field pulse to a plurality of magnetic sense elements in a second group of the second bridge circuit prior to measuring the direction and magnitude of the external field and (ii) the second stabilization field while measuring the direction and magnitude of the external field utilizing the plurality of magnetic sense elements of the second group of the second bridge circuit comprises:

applying the second reset field pulse, greater in magnitude, but in a same direction as a default reset field pulse if the determined component of the external field is in an opposite direction of the default stabilization field and less than half the sense element anisotropy; and applying the second stabilization field that is greater in magnitude as the default stabilization field and in a same direction as default stabilization field.

9. The method of claim 1, wherein applying at least one of (i) the second reset field pulse to a plurality of magnetic sense elements in a second group of the second bridge circuit prior to measuring the direction and magnitude of the external field, and (ii) the second stabilization field while measuring the direction and magnitude of the external field utilizing the plurality of magnetic sense elements of the second group of the second bridge circuit comprises:

applying the second reset field pulse in a same direction as the default stabilization field if the determined component of the external field is in an opposite direction of the default stabilization field and less than 50% of the default stabilization field; and applying the second stabilization field that is approximately the same as the default stabilization field.

10. The method of claim 1, wherein applying the second reset field pulse to a plurality of magnetic sense elements in a second group of the second bridge circuit prior to measuring the direction and magnitude of the external field comprises:

applying a hard axis field in response to sensing an external field while applying the second reset field pulse.

11. The method of claim 1, wherein applying the second stabilization field while measuring the direction and magnitude of the external field utilizing the plurality of magnetic sense elements of the second group of the second bridge circuit comprises:
  applying a second stabilization current through a second current line adjacent the magnetic sense elements, the magnitude of the second stabilization current determined by the sensed external field.

12. The method of claim 1, wherein applying the second stabilization field while measuring the direction and magnitude of the external field utilizing the plurality of magnetic sense elements of the second group of the second bridge circuit comprises:
  adjusting a second stabilization current to set a net stabilization field to a predetermined value, wherein the net stabilization field consists of the second stabilization field and the external field.

13. The method of claim 1, wherein applying the second reset field pulse to a plurality of magnetic sense elements in a second group of the second bridge circuit prior to measuring the direction and magnitude of the external field comprises:
  adjusting the second reset field pulse for setting a net reset field pulse to a predetermined value, wherein the net reset field pulse consists of the second reset field pulse and the external field.

14. A method for operating a plurality of magnetic sense elements, the method comprising:
  applying a first reset current pulse to a first current line adjacent to a plurality of magnetic sense elements in a first group, the application of the first reset current pulse generating a first reset field pulse;
  applying a first stabilization current to the first current line, the application of the first stabilization current generating a first stabilization field;
  determining a component of an external field in a first direction as sensed by the plurality of magnetic sense elements in the first group;
  determining, based on the determined component of the external field, (i) a second reset current pulse for generating a second reset field pulse; and (ii) a second stabilization current for generating a second stabilization field, the second reset field pulse and the second stabilization field for application to a second group of sense elements;
  applying at least one of (i) the second reset current pulse to the second group of sense elements prior to measuring a direction and magnitude of an external field, and (ii) the second stabilization current while measuring a direction and magnitude of an external field utilizing the second group of magnetic sense elements; and
  measuring a direction and magnitude of an external field utilizing magnetic sense elements in a second group.

15. The method of claim 14, wherein applying at least one of (i) the second reset current pulse to the second group of sense elements prior to measuring the direction and magnitude of the external field, and (ii) the second stabilization current while measuring the direction and magnitude of the external field utilizing the second group of magnetic sense elements comprises:
  applying the second reset current pulse in a direction opposed to a default stabilization current if the determined direction of the external field is in an opposite direction of the default stabilization field and greater than 175% of a default stabilization field, and applying the second stabilization current that is approximately the same as the first stabilization current;
  applying the second reset current pulse in the direction opposed to the default stabilization current if the determined direction of the external field is in the opposite direction of the default stabilization field and between 75% to 175% of the default stabilization field;
  applying the second reset current pulse in the direction opposed to the default stabilization current if the determined component of the external field is in the opposite direction of the default stabilization field and less than 75% of the default stabilization field, and applying a second stabilization current that is the opposite direction of the default stabilization field and with a same magnitude of the default stabilization current;
  applying the second reset current pulse in a direction of the default stabilization current if the determined component of the external field is in a same direction as the default stabilization field and greater than 175% of the default stabilization field, and applying the second stabilization current that has approximately a same magnitude as the default stabilization field and an opposite direction to the default stabilization current;
  applying the second reset current pulse in a same direction as the default stabilization current if the determined component of the external field is in the same direction of the default stabilization field and between 75% to 175% of the default stabilization field; and
  applying the second reset current pulse in the same direction as the default stabilization current if the determined component of the external field is in the same direction as the default stabilization field and less than 75% of the default stabilization field, and applying the second stabilization current that is approximately the same as the default stabilization current.

16. The method of claim 14, wherein
applying at least one of (i) the second reset current pulse to the second group of sense elements prior to measuring the direction and magnitude of the external field, and (ii) the second stabilization current while measuring the direction and magnitude of the external field utilizing the second group of magnetic sense elements comprises:
  applying the second reset current pulse in a direction opposed to a default stabilization current if the determined direction of the external field is in an opposite direction of the default stabilization field and greater than half a sense element anisotropy, and applying a second stabilization current that is the same as the first stabilization current;
  applying the second reset current pulse in the direction of the default stabilization current if the determined direction of the external field is in a same direction as the default stabilization field and greater than 175% of the default stabilization field, and applying the second stabilization current that has a same magnitude of the default stabilization current and in an opposite direction to the default stabilization current;
  applying the second reset current pulse in the same direction as the default stabilization current if the determined direction of the external field is in the same direction of the default stabilization field and between 75% to 175% of the default stabilization field;
  applying the second reset current pulse in the same direction as the default stabilization current if the determined direction of the external field is in the same direction as the default stabilization field and less than 75% of the default stabilization field, and applying the second stabilization current that is the opposite direction of as the default stabilization current;

applying the second reset current pulse, greater in magnitude than a default reset current and in a same direction as the default reset current if the determined direction of the external field is in the opposite direction of the default stabilization field and between less than half the sense element anisotropy and 50% of the default stabilization field, and applying the second stabilization current that is greater in magnitude than the default stabilization current and and in the same direction as default stabilization current; and applying the second reset current pulse in the same direction as the default stabilization field if the determined direction of the external field is in the opposite direction of the default stabilization field and less than 50% of the default stabilization field, and applying the second stabilization current that is approximately the same as the default stabilization current.

\* \* \* \* \*